US012562568B2

(12) United States Patent
Deshpande

(10) Patent No.: US 12,562,568 B2
(45) Date of Patent: Feb. 24, 2026

(54) LOAD BANK SYSTEM AND METHOD THEREOF TO GENERATE LARGE NUMBER OF DISCRETE LOADING STEPS

(71) Applicant: Vijay Vasant Deshpande, Pune (IN)

(72) Inventor: Vijay Vasant Deshpande, Pune (IN)

( * ) Notice: Subject to any disclaimer, the term of this patent is extended or adjusted under 35 U.S.C. 154(b) by 398 days.

(21) Appl. No.: 18/001,667

(22) PCT Filed: Sep. 12, 2022

(86) PCT No.: PCT/IN2022/050811
§ 371 (c)(1),
(2) Date: Dec. 13, 2022

(87) PCT Pub. No.: WO2023/089628
PCT Pub. Date: May 25, 2023

(65) Prior Publication Data
US 2025/0286369 A1 Sep. 11, 2025

(30) Foreign Application Priority Data
Nov. 17, 2021 (IN) .............................. 202121052822

(51) Int. Cl.
*H02J 1/00* (2006.01)
*G01R 31/42* (2006.01)
(52) U.S. Cl.
CPC ................ *H02J 1/00* (2013.01); *G01R 31/42* (2013.01)
(58) Field of Classification Search
CPC ............ H02J 1/00; G01R 31/42; G01R 31/34
See application file for complete search history.

(56) References Cited

U.S. PATENT DOCUMENTS

| | | | |
|---|---|---|---|
| 4,042,830 A | 8/1977 | Kellenbenz et al. | |
| 4,445,047 A * | 4/1984 | Cannon ................ | G01R 31/343 |
| | | | 324/750.08 |
| 5,565,716 A | 10/1996 | Tierney, Jr. | |
| 8,108,162 B2 | 1/2012 | Matsumoto | |
| 2005/0134248 A1* | 6/2005 | Locker .................. | H02M 5/293 |
| | | | 323/285 |
| 2009/0234600 A1* | 9/2009 | Matsumoto .......... | G01R 31/343 |
| | | | 323/354 |
| 2011/0025059 A1 | 2/2011 | Helle et al. | |
| 2012/0110386 A1 | 5/2012 | Hancock et al. | |
| 2015/0054483 A1* | 2/2015 | Palatini ................. | H02J 3/1828 |
| | | | 323/293 |
| 2017/0315184 A1* | 11/2017 | Morin .................... | G01R 31/40 |

* cited by examiner

*Primary Examiner* — Eman A Alkafawi
*Assistant Examiner* — Joseph O Nyamogo
(74) *Attorney, Agent, or Firm* — Renner, Otto, Boisselle & Sklar, LLP

(57) ABSTRACT

The present invention relates generally to Load Banks for testing generators and electric power sources and more particularly the present invention discloses a load bank system circuit topology and method thereof, to generate large number of discrete loading steps. The system and method thereof employs at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test, to generate a large number of loading steps having minimum number of duplicate loading steps, minimum number of high power difference loading steps, high maximum to minimum load ratio and lowest value average resolution of the loading step.

29 Claims, 10 Drawing Sheets

Table 6

| R3A+ R3B→ | 500+ 500Ω | Power W | Diff W | 600+ 400Ω | Power W | Diff W | 700+ 300Ω | Power W | Diff W | 800+ 200Ω | Power W | Diff W | 900+ 100Ω | Power W | Diff W |
|---|---|---|---|---|---|---|---|---|---|---|---|---|---|---|---|
| | 2500 | 400 | | 2600 | 385 | | 2700 | 370 | | 2800 | 357 | | 2900 | 345 | |
| | 1500 | 667 | 267 | 1600 | 625 | 240 | 1700 | 588 | 218 | 1800 | 556 | 198 | 1900 | 526 | 181 |
| | 1167 | 857 | 190 | 1267 | 789 | 164 | 1367 | 732 | 143 | 1467 | 682 | 126 | 1567 | 638 | 112 |
| | 1000 | 1000 | 143 | 1000 | 1000 | 211 | 1000 | 1000 | 268 | 1000 | 1000 | 318 | 1000 | 1000 | 362 |
| | 1000 | 1000 | 0 | 1000 | 1000 | 0 | 1000 | 1000 | 0 | 1000 | 1000 | 0 | 1000 | 1000 | 0 |
| | 900 | 1111 | 111 | 933 | 1071 | 71 | 961 | 1041 | 41 | 982 | 1019 | 19 | 995 | 1005 | 5 |
| | 833 | 1200 | 89 | 886 | 1129 | 58 | 931 | 1074 | 34 | 967 | 1034 | 16 | 991 | 1009 | 4 |
| | 786 | 1273 | 73 | 850 | 1176 | 47 | 907 | 1103 | 28 | 954 | 1048 | 14 | 987 | 1013 | 4 |
| | 600 | 1667 | 394 | 615 | 1625 | 449 | 630 | 1588 | 486 | 643 | 1556 | 507 | 655 | 1526 | 513 |
| | 571 | 1750 | 83 | 579 | 1727 | 102 | 585 | 1708 | 120 | 595 | 1682 | 126 | 610 | 1638 | 112 |
| | 538 | 1857 | 107 | 559 | 1789 | 62 | 577 | 1732 | 23 | 591 | 1692 | 10 | 596 | 1679 | 40 |
| | 500 | 2000 | 143 | 500 | 2000 | 211 | 500 | 2000 | 268 | 500 | 2000 | 308 | 500 | 2000 | 321 |
| | 500 | 2000 | 0 | 500 | 2000 | 0 | 500 | 2000 | 0 | 500 | 2000 | 0 | 500 | 2000 | 0 |
| | 455 | 2200 | 200 | 470 | 2129 | 129 | 482 | 2074 | 74 | 492 | 2034 | 34 | 498 | 2009 | 9 |
| | 455 | 2200 | 0 | 459 | 2176 | 47 | 476 | 2105 | 28 | 488 | 2048 | 14 | 497 | 2013 | 4 |
| | 440 | 2273 | 79 | 437 | 2290 | 114 | 422 | 2370 | 268 | 424 | 2357 | 309 | 426 | 2345 | 332 |
| | 417 | 2400 | 127 | 419 | 2385 | 94 | 416 | 2405 | 35 | 392 | 2552 | 195 | 396 | 2526 | 181 |
| | 400 | 2500 | 100 | 398 | 2514 | 129 | 391 | 2556 | 151 | 391 | 2556 | 4 | 373 | 2679 | 152 |
| | 375 | 2667 | 167 | 381 | 2625 | 111 | 386 | 2588 | 32 | 379 | 2636 | 81 | 365 | 2743 | 65 |
| | 364 | 2750 | 83 | 367 | 2727 | 102 | 369 | 2708 | 120 | 371 | 2692 | 56 | 361 | 2771 | 28 |
| | 333 | 3000 | 250 | 333 | 3000 | 273 | 333 | 3000 | 292 | 333 | 3000 | 308 | 333 | 3000 | 229 |
| | 333 | 3000 | 0 | 333 | 3000 | 0 | 333 | 3000 | 0 | 333 | 3000 | 0 | 333 | 3000 | 0 |
| | 333 | 3000 | 0 | 333 | 3000 | 0 | 333 | 3000 | 0 | 333 | 3000 | 0 | 333 | 3000 | 0 |
| | 321 | 3111 | 111 | 326 | 3071 | 71 | 329 | 3041 | 41 | 331 | 3019 | 19 | 333 | 3005 | 5 |
| | 313 | 3200 | 89 | 320 | 3129 | 58 | 325 | 3074 | 34 | 330 | 3034 | 16 | 332 | 3009 | 4 |
| | 286 | 3500 | 300 | 285 | 3514 | 384 | 281 | 3556 | 482 | 281 | 3556 | 521 | 284 | 3526 | 517 |
| | 273 | 3667 | 167 | 276 | 3625 | 111 | 279 | 3588 | 32 | 275 | 3636 | 81 | 265 | 3771 | 245 |
| | 250 | 4000 | 333 | 250 | 4000 | 375 | 250 | 4000 | 412 | 250 | 4000 | 364 | 250 | 4000 | 229 |
| | 238 | 4200 | 200 | 242 | 4129 | 129 | 245 | 4074 | 74 | 248 | 4034 | 34 | 249 | 4009 | 9 |
| | 238 | 4200 | 0 | 233 | 4290 | 161 | 227 | 4405 | 321 | 220 | 4552 | 517 | 211 | 4743 | 734 |
| | 200 | 5000 | 800 | 200 | 5000 | 710 | 200 | 5000 | 595 | 200 | 5000 | 448 | 200 | 5000 | 257 |
| | | | | | | | | | | | | | | | |
| Duplicate | | 6 | | | 4 | | | 4 | | | 4 | | | 4 | |
| Step>500 | | 1 | | | 1 | | | 0 | | | 0 | | | 1 | |
| Diff<10 | | 0 | | | 0 | | | 0 | | | 1 | | | 8 | |
| MAX/MIN | 13 | | NOT OK | 13 | 0 | NOT OK | 14 | 14 | OK | 14 | | NOT OK | 15 | | NOT OK |

Fig. 13

Table 8

| $R_{T7T8}$ Ω | Power W | Diff | | $R_{T7T8}$ Ω | Power W | Diff | | $R_{T7T8}$ Ω | Power W | Diff | Steps |
|---|---|---|---|---|---|---|---|---|---|---|---|
| R1 = 250 Ω; R2 = 125 Ω; R4 = 500 Ω; R5 = 1000 Ω; | | | | | | | | Combined | | | |
| RL6_ON R3A = 90 Ω | | | | RL6_OFF R3A = 150 Ω | | | | RL6_ON and RL6_OFF | | | |
| 1590 | 629 | | | 1650 | 606 | | | 1650 | 606 | | 1 |
| 1000 | 1000 | 371 | | 1000 | 1000 | 394 | | 1590 | 629 | 23 | |
| 1000 | 1000 | 0 | | 1000 | 1000 | 0 | | 1000 | 1000 | 371 | |
| 656 | 1523 | 523 | | 693 | 1444 | 444 | | 1000 | 1000 | 0 | |
| 497 | 2014 | 490 | | 491 | 2036 | 592 | | 1000 | 1000 | 0 | |
| 346 | 2889 | 875 | | 346 | 2889 | 853 | | 1000 | 1000 | 0 | |
| 333 | 3000 | 111 | | 333 | 3000 | 111 | | 693 | 1444 | 444 | 4 |
| 250 | 4000 | 1000 | | 275 | 3636 | 636 | | 656 | 1523 | 80 | |
| 215 | 4651 | 651 | | 265 | 3768 | 132 | | 497 | 2014 | 490 | |
| 205 | 4869 | 218 | | 259 | 3861 | 93 | | 491 | 2036 | 22 | |
| 200 | 5002 | 134 | | 252 | 3975 | 113 | | 346 | 2889 | 853 | |
| 192 | 5197 | 195 | | 250 | 4000 | 25 | | 346 | 2889 | 0 | |
| 168 | 5968 | 771 | | 194 | 5160 | 1160 | | 333 | 3000 | 111 | 9 |
| 157 | 6371 | 403 | | 183 | 5457 | 297 | | 333 | 3000 | 0 | |
| 131 | 7651 | 1280 | | 151 | 6636 | 1179 | | 275 | 3636 | 636 | 10 |
| 125 | 8002 | 351 | | 146 | 6861 | 225 | | 265 | 3768 | 132 | |
| 116 | 8651 | 649 | | 131 | 7636 | 775 | | 259 | 3861 | 93 | |
| 113 | 8869 | 218 | | 129 | 7768 | 132 | | 252 | 3975 | 113 | |
| 111 | 9002 | 134 | | 127 | 7861 | 93 | | 250 | 4000 | 25 | |
| 109 | 9197 | 195 | | 125 | 7975 | 113 | | 250 | 4000 | 0 | |
| 100 | 9968 | 771 | | 109 | 9160 | 1185 | | 215 | 4651 | 651 | 15 |
| 96 | 10371 | 403 | | 106 | 9457 | 297 | | 205 | 4869 | 218 | |
| 86 | 11651 | 1280 | | 94 | 10636 | 1179 | | 200 | 5002 | 134 | |
| 83 | 12000 | 349 | | 92 | 10861 | 225 | | 194 | 5160 | 158 | |
| 83 | 12002 | 2 | | 83 | 12000 | 1139 | | 192 | 5197 | 37 | |
| 79 | 12629 | 627 | | 79 | 12606 | 606 | | 183 | 5457 | 260 | |
| 77 | 13000 | 371 | | 77 | 13000 | 394 | | 168 | 5968 | 511 | |
| 74 | 13523 | 523 | | 74 | 13444 | 444 | | 157 | 6371 | 403 | |
| 71 | 14014 | 490 | | 71 | 14036 | 592 | | 151 | 6636 | 265 | |
| 67 | 15000 | 986 | | 67 | 15000 | 964 | | 146 | 6861 | 225 | |

Fig. 14

Table 8 contd.

| 63 | 16000 | 1000 | | 63 | 16000 | 1000 |
|---|---|---|---|---|---|---|
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |

| 131 | 7636 | 775 | |
|---|---|---|---|
| 131 | 7651 | 15 | |
| 129 | 7768 | 117 | |
| 127 | 7861 | 93 | |
| 125 | 7975 | 113 | |
| 125 | 8002 | 28 | |
| 116 | 8651 | 649 | |
| 113 | 8869 | 218 | |
| 111 | 9002 | 134 | |
| 109 | 9160 | 158 | |
| 109 | 9197 | 37 | |
| 106 | 9457 | 260 | |
| 100 | 9968 | 511 | |
| 96.4 | 10371 | 403 | |
| 94.0 | 10636 | 265 | |
| 92.1 | 10861 | 225 | |
| 85.8 | 11651 | 790 | |
| 83.3 | 12000 | 349 | |
| 83.3 | 12000 | 0 | |
| 83.3 | 12002 | 2 | 43 |
| 79.3 | 12606 | 604 | |
| 79.2 | 12629 | 23 | |
| 76.9 | 13000 | 371 | |
| 76.9 | 13000 | 0 | |
| 74.4 | 13444 | 444 | 47 |
| 73.9 | 13523 | 80 | |
| 71.4 | 14014 | 490 | |
| 71.2 | 14036 | 22 | |
| 66.7 | 15000 | 964 | |
| 66.7 | 15000 | 0 | |
| 62.5 | 16000 | 1000 | 52 |
| 62.5 | 16000 | 0 | |

Fig. 15

LOAD BANK SYSTEM AND METHOD THEREOF TO GENERATE LARGE NUMBER OF DISCRETE LOADING STEPS

This application is a national phase of International Application No. PCT/IN2022/050811 filed Sep. 12, 2022, which claims priority to India application No. 202121052822 filed Nov. 17, 2021, the entire disclosures of which are hereby incorporated by reference.

FIELD OF INVENTION

This invention relates generally to Load Banks for testing generators and electric power sources and more particularly to a load bank system circuit topology and method thereof, to generate large number of discrete loading steps.

BACKGROUND OF INVENTION

A Load Bank is a device which develops an electrical load, applies the load to an electrical power source and converts or dissipates the resultant power output of the source. A Load Bank is intended to accurately mimic the operational or "real" load which a power source will see in actual application.

Load banks are mainly resistive networks used to dissipate the electrical energy. For example, diesel generators are used in critical applications in airports and nuclear installations. These Stand-by electrical power sources such as diesel generators etc. are not put to use continuously. They take over only during disruption in the main power supply, and hence may remain continuously unused for a long period of time. They may be designed for a particular power rating, but it is important to guarantee their functioning in real life situations which might involve different types of power supply disturbances such as—Transients, Interruptions, Sag/ Under-voltage, Swell/Over-voltage, Waveform distortion, Voltage fluctuation or Frequency variations. These generators have to be frequently tested at rated full load condition, to verify that generators are working properly. It has been found that, if a diesel generator always runs on light loads, then, due to wet stacking (unburnt fuel or carbon), diesel engine fuel consumption goes up and engine life reduces. To avoid wet stacking, it is necessary to operate generators at rated full load at regular intervals. For this purpose, load shedding type load banks are used.

Newly installed power supply systems in buildings have to be tested for their designed power handling capability. Here too, load banks are employed. In all such applications, the load bank should be capable of generating large number of discrete loading steps. Larger number of discrete steps allow accurate loading of power source under test. Also, the loading steps need to be sufficiently small such that damage to the power source engine due to block loading does not occur.

It is known in the art to provide a load bank with resistor coil assemblies connected and controlled through switching network in different configurations. The Cannon U.S. Pat. No. 4,445,047, describes a portable load bank for loading the generator, having set of low resistance coils. A switching network is provided for loading a three phase generator at three discrete load levels. The switching network comprising three silicon controlled rectifiers for controlling three phase load. The generator is loaded at three discrete levels by controlling the duty cycle, with full load level being at full duty cycle basis. This patent also describes alternative embodiment for testing dc generator. It has three groups of coils controlled by three switches. Here the three switches are provided by a common rotary switch. By closing the first switch first set of coils are energized. The load on the generator may then be increased by the closure of second switch placing the second group coils are on line. Finally, the third switch may also be closed causing current also to flow through the third group of resistance coils. However, the art discloses loading of the generator at three discrete levels but fails to provide any teachings towards large number of loading step generating configuration of the coils and switches.

It is known in the art to provide a load bank with variable resistance with cooling mechanism. The Tierney U.S. Pat. No. 5,565,716, describes Variable resistance Liquid cooled Load Bank. A load bank is constructed using tubes made from electrically conductive material. Electrically conductive clamps are positioned to electrically connect tubes. The positioning of each clamp is adjustable along the length of the connected tubes. A combination of the clamps and the tubes form an electrically resistive current-carrying circuit that serves as the load for a power source while the cooling fluid serves to dissipate the heat generated in the load. In this design, the circuit needs to be turned OFF, whenever the value of load resistance has to be changed.

It is also known in the art to provide load simulator systems which are capable of loading the power sources. The Carl W. Kellenbenz U.S. Pat. No. 4,042,830 describes Solid-state programmable dynamic load simulator. The power source is loaded using five loads. First load being any resistive load providing a continuously variable power load to the source. Remaining four banks provide pulsating loads.

These are controlled through electronic power switches using Thyristors. In the example given, first load is continuously variable over the range of 0 to 15 kW. The other four loads had values set at 1 kW, 2 kW, 4 kW, and 8 kW for each of the four switches respectively. In order to generate 7 kW as an example, loads 1 kW, 2 kW and 4 kW are turned ON using the power switches. Similarly to generate 11 kW, loads 1 kW, 2 kW and 8 kW are turned ON. Thus any load value from 1 kW to 15 kW can be generated, by controlling the switches.

Further in the art the Kesafumi Matsumoto, Atsugi (JP) U.S. Pat. No. 8,108,162 B2 describes the determination of load bank resistors by dividing a total maximum power capacity of the resistor bank group sequentially based on binary system and arranging the results in an order from a higher priority to a lower priority of the power capacity corresponding to $(\frac{1}{2})$, $(\frac{1}{4})$ up to $(1/(2n-1))$. For example, for a load bank of maximum capacity of 2000 kW, and for n=7 switches, the values based on the binary system are, 1000 kW $(\frac{1}{2})$, 500 kW $(\frac{1}{4})$, 250 kW $(\frac{1}{8})$, 125 kW $(\frac{1}{16})$, 62.5 kW $(\frac{1}{32})$, 31.25 kW $(\frac{1}{64})$, 15.625 kW $(\frac{1}{128})$. The least count for this system is given by $(15.625/2000)\times100=0.78125\%$. Therefore, using this load bank, load levels from 15.625 kW up to 2000 kW could be generated with a resolution of 15.625 kW or 0.78125%. Total number of steps generated by this load bank are $127=(1+2+4+8+16+32+64)$. The FIG. 1 illustrates prior art block diagram of resistor banks of a load calculation control apparatus by Matsumoto. It mainly consists of eight ON/OFF switches (CL), and eight load resistors ($\alpha 1$ to $\alpha 8$).

Further, in the art the US 2011/0025059 A1 describes Controllable switch. Controllable Switch may be implemented as one or more IGBTs, one or more thyristors, one or more contactors etc. Using these switches load dump circuits are implemented. Examples of a DC load dump circuit, AC star connected load dump circuit and AC delta connected load dump circuits are given.

It is also known in the art to provide testing solutions for testing emergency power supply system. The US 2012/0110386 A1 discloses an automatically varying load bank to suit a particular legislated criteria, such as defined by an applicable regulation such as NFPA 99 or 110. Using variable loads can avoid or reduce wet-stacking of the engine, for example, by allowing the load to be sized in accordance with the engine's nameplate rating. The load bank is controlled using automatic transfer switch.

As shown in FIG. 3 a load bank topology was published by Vijay Deshpande, the inventor of the present invention in the Electronic Design magazine (Jul. 21, 2020). It consists of four switches SW1, SW2, J1 and J2. Switch SW1 is simple ON/OFF switch, remaining three switches are single pole double throw (SPDT) type switches. Also uses five resistors Ra, Rb, Rc, Rd and Re. The topology generates twelve discrete load power steps with maximum load power to minimum load power ratio of the value 8.

The prior art describes determination of load bank resistors based on binary. In such a case, rating of one of the load bank resistors is half of the total power rating of load bank. For load bank with 5 or more switches, this resistor becomes very large. Thus constraints on the power ratings of the loading resistors arises.

Using single value resistor, with prior art load bank circuit topology/network, one can generate only as many steps as the number of switches used.

However, none of the existing art provides a load bank system where a large number of loading steps are generated when the resistors used for the load bank system are multi value resistors (resistors with at least two different values) or even when the resistors used for the load bank system are single value resistors (all resistors with identical values). In addition generating minimum number of duplicate loading steps and generating minimum number of high power difference loading steps is necessary. Further, none of the existing art provides a load bank system having high maximum to minimum load ratio and lowest value average resolution of the loading step.

Accordingly, it is seen that a need remains for the provision of a portable, relatively lightweight, compact load bank that may generate a large number of loading steps when the resistors used for the load bank system are all single value resistors (resistors with identical values, which is also the base resistance power) or when the resistors used for the load bank system are multi value resistors (resistors with at least two different power values), the large number of loading steps having minimum number of duplicate loading steps, minimum number of high power difference loading steps, high maximum to minimum load ratio and lowest value average resolution of the loading step.

Objects of the Present Invention

An object of the present invention is to provide an improved load bank topology for generating large number of loading steps, without any constraints on the power ratings of the loading resistors.

Another object of the invention is to generate large number of loading steps for a load bank which uses all resistors with identical values. Such load banks are very cost effective and easy to maintain.

Yet another object of the invention is to generate large number of discrete loading steps having minimum number of duplicate loading steps, and minimum number of high power difference loading steps.

Also, another object of the invention is to generate large number of discrete loading steps having high maximum to minimum load ratio and lowest value average resolution of the loading step.

SUMMARY OF THE INVENTION

It is an object of the present invention to provide an improved load bank topology for generating large number of loading steps, without any constraints on the power ratings of the loading resistors.

In accomplishing the above and other objects, there has been provided, in accordance with an embodiment of the present invention, a load bank system circuit topology and method thereof, to generate large number of discrete loading steps. The system and method thereof employs at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test, to generate a large number of loading steps. The system and method there of the present invention generate a large number of loading steps when the resistors used for the load bank system are all single value resistors (resistors with identical values, which is also the base resistance power) or when the resistors used for the load bank system are multi value resistors (resistors with at least two different power values), the large number of loading steps having minimum number of duplicate loading steps, minimum number of high power difference loading steps, high maximum to minimum load ratio and lowest value average resolution of the loading step. According to one of the implementation of the system and method there of the present invention, a load bank with single value resistors is a preferred embodiment.

The load bank system is constituted through a circuit topology in which a pole terminal of the RL1 is electrically coupled to a first terminal of the resistor R1 and to a NC (Normally Closed) terminal of the RL2, a NC terminal of the RL1 is left open and a NO (Normally Open) terminal of the RL1 is electrically coupled to the terminal T5 of the load bank. Further, a pole terminal of the RL2 is electrically coupled to a first terminal of the resistor R2. According to the load bank system circuit of the present invention a first terminal of the resistor R3 is electrically coupled to the T5 terminal of load bank, a second terminal of the resistor R3 is electrically coupled to a pole terminal of the RL3, the Tap of R3 is moved to a desired location on the resistor R3 and is fixed to divide the resistor R3 in parts, and the Tap is electrically coupled to a NO terminal of RL2 and a NO terminal of RL4. Further, a pole terminal of RL4 is electrically coupled to a first terminal of R4, a second terminal of R4 is electrically coupled to a pole terminal of RL5. Further, in the load bank system circuit of the present invention a first terminal of R5 is electrically coupled to a pole terminal of RL5, a NO terminal of RL5 is electrically coupled to the terminal T5 of load bank, and a NC terminal of RL5 is left open. Consecutively, a second terminal of R1, a second terminal of R2 and a second terminal of R5 are electrically coupled to the terminal T6 of the load bank, and a NO terminal of RL3 and a NC terminal of RL4 are electrically coupled to the terminal T6.

According to one of the embodiment of the present invention a method for a load bank system for generating large number of loading steps includes providing, a load bank system for generating large number of loading steps having at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test. Further, the method includes connecting, the load bank system to a power source under test through the two terminals, terminal T5, and terminal T6. Further, the method includes operating, the plurality of switches in possible combination to generate the plurality of loading steps. The relay switches of the load bank system can be operated through control mechanism.

BRIEF DESCRIPTION OF THE DRAWINGS

The embodiments can be better understood with reference to the following drawings and description. The components in the figures are not necessarily to scale, the emphasis instead being placed upon illustrating the principles of the embodiments. Moreover, the figures, like reference numerals designate corresponding parts throughout the different views.

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure 1:
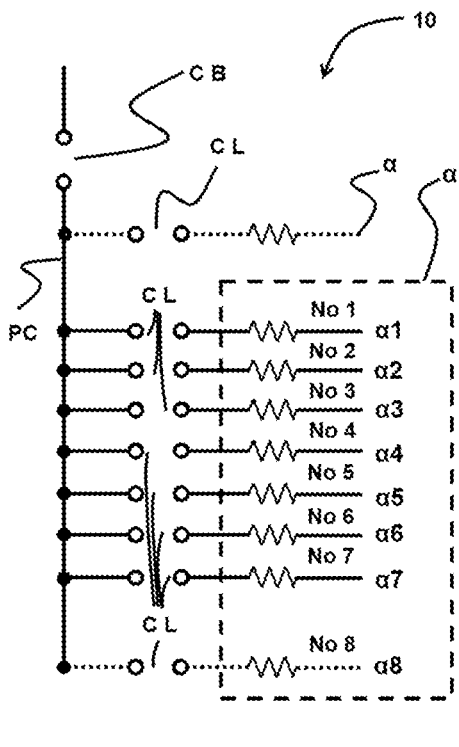

The above and other objects, features, and advantages of the present invention will be more clearly understood from the following detailed description taken in conjunction with the accompanying drawings, in which:

FIG. 1 (Prior Art) is reproduction of prior art block diagram of resistor banks of a load calculation control apparatus by Matsumoto.

Figure 2:
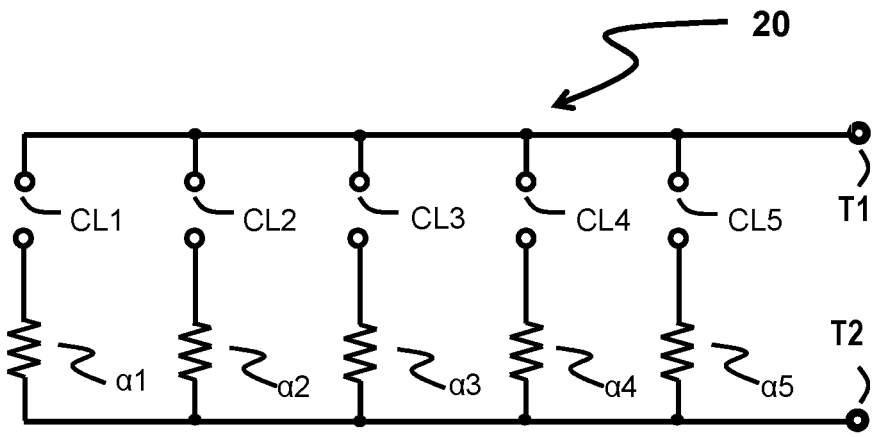

FIG. 2 (Prior Art) illustrates prior art circuit diagram of resistor banks of a load calculation control apparatus of FIG. 1, redrawn for 5 switches and 5 loads.

Figure 3:
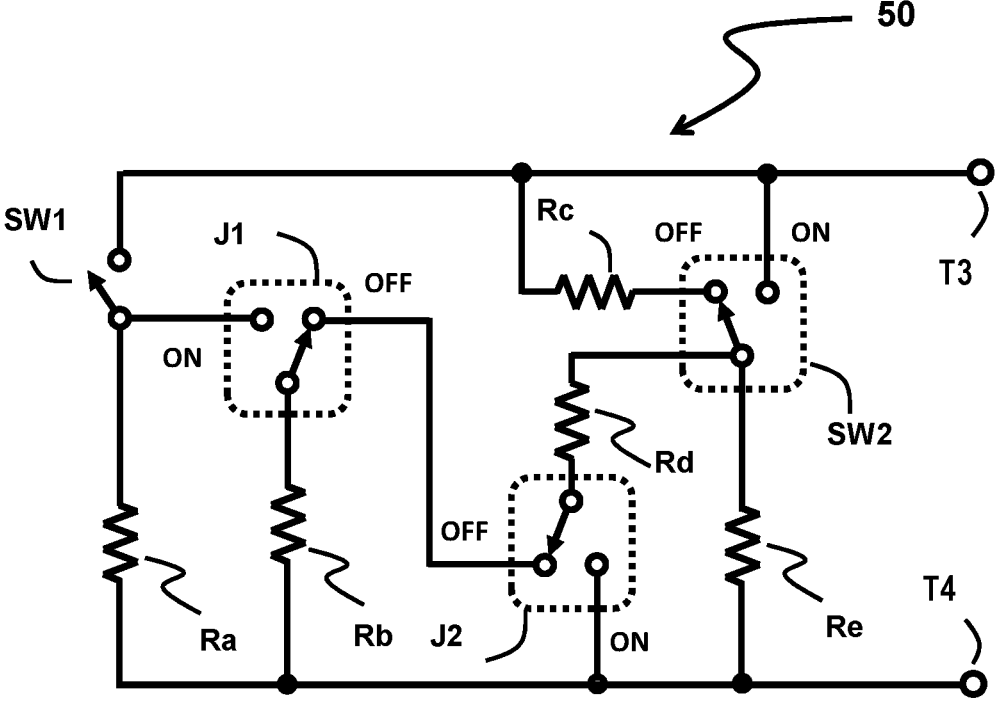

FIG. 3 (Prior Art) Shows prior art resistor load bank topology which uses 4 switches and 5 resistors. (Reproduced from Electronic Design magazine)

Figure 4:
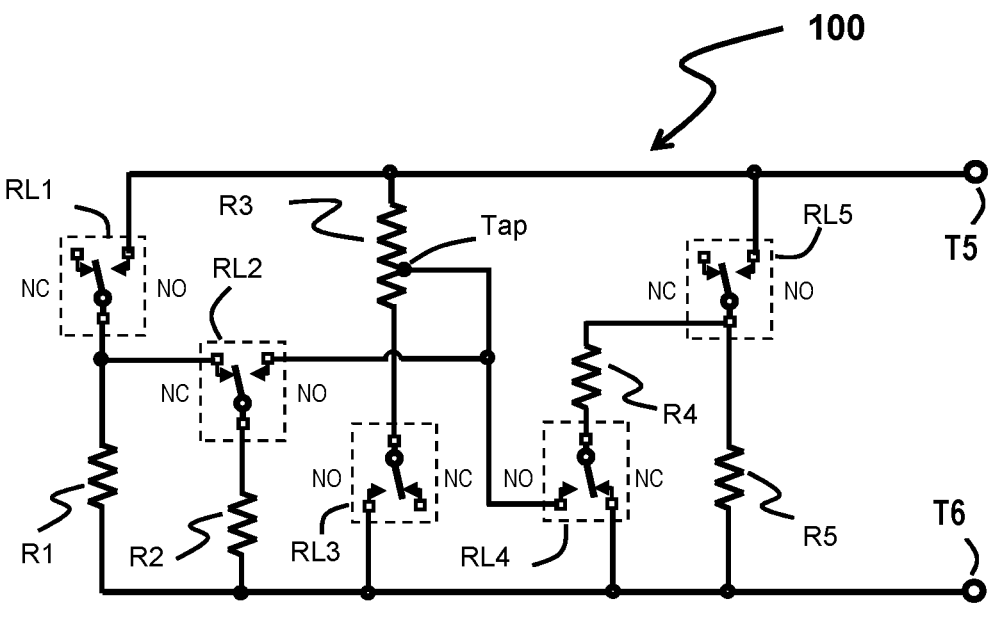

FIG. 4 schematically illustrates a load bank system circuit diagram/topology for generating large number of loading steps in accordance with the present invention.

Figure 5:
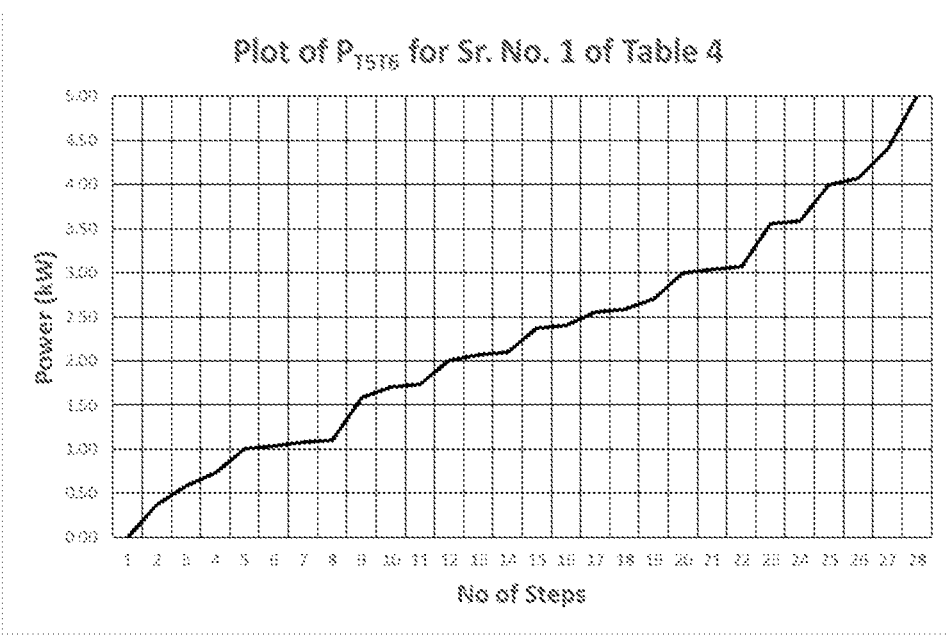

FIG. 5 illustrates a plot of power loading steps generated by the load bank system circuit/topology in accordance with the present invention.

Figure 6:
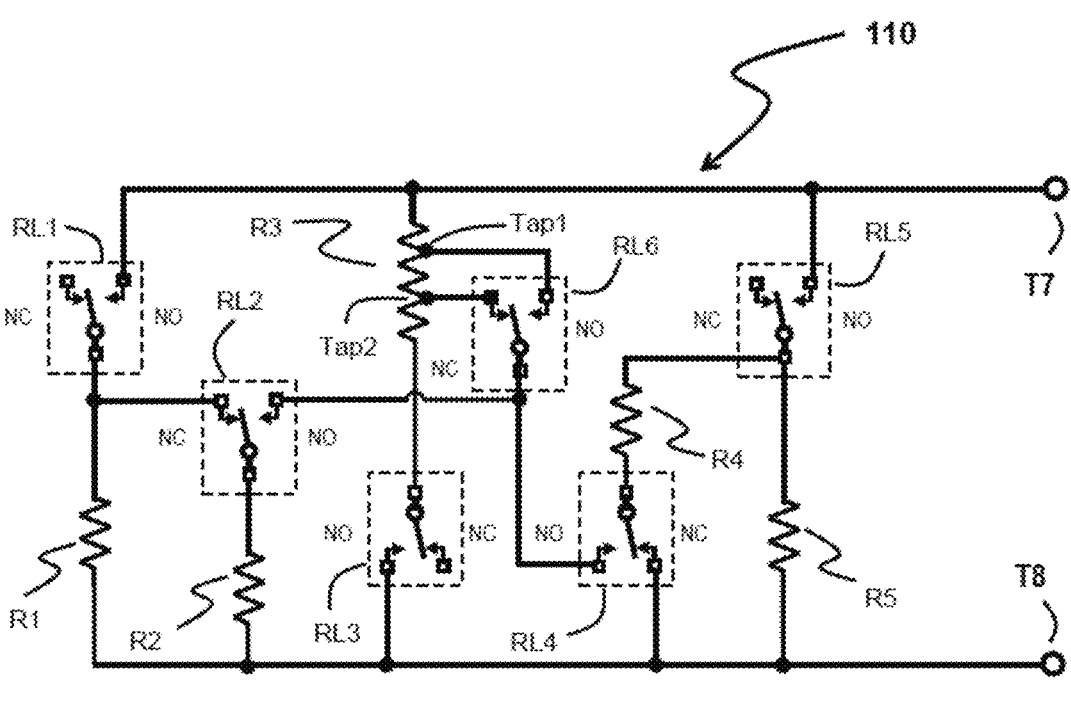

FIG. 6 schematically illustrates an alternate embodiment of the load bank system circuit/topology with resistor having two taps and one additional relay.

Figure 7:
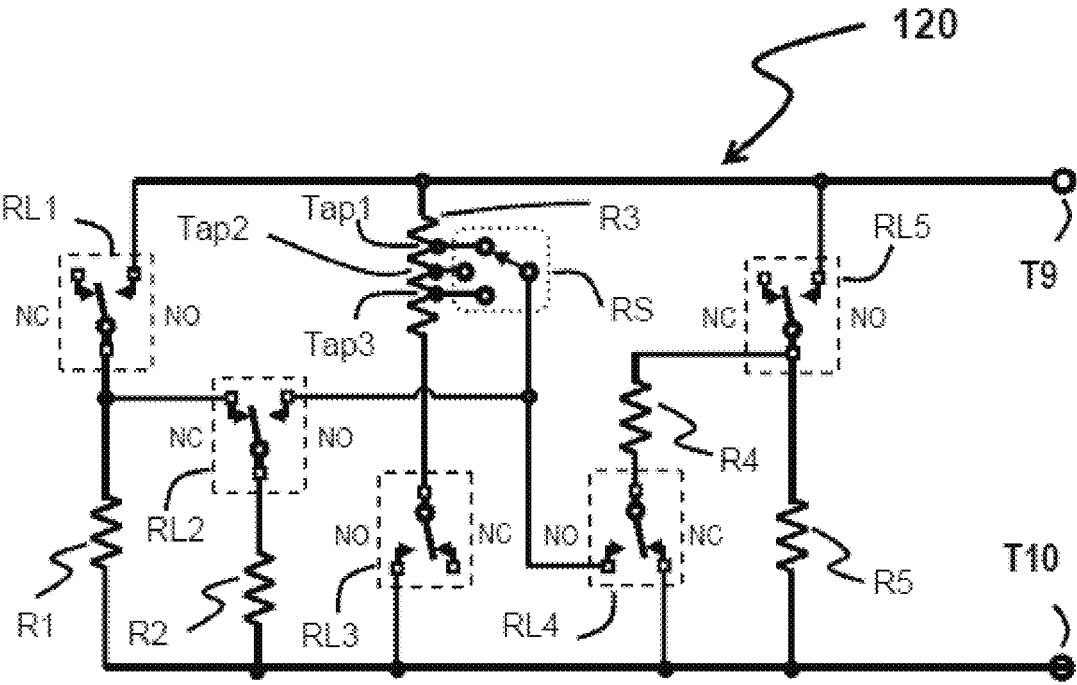

FIG. 7 schematically illustrates an alternate embodiment of the improved load bank system circuit/topology with resistor having three taps and a rotary switch.

Figure 8:
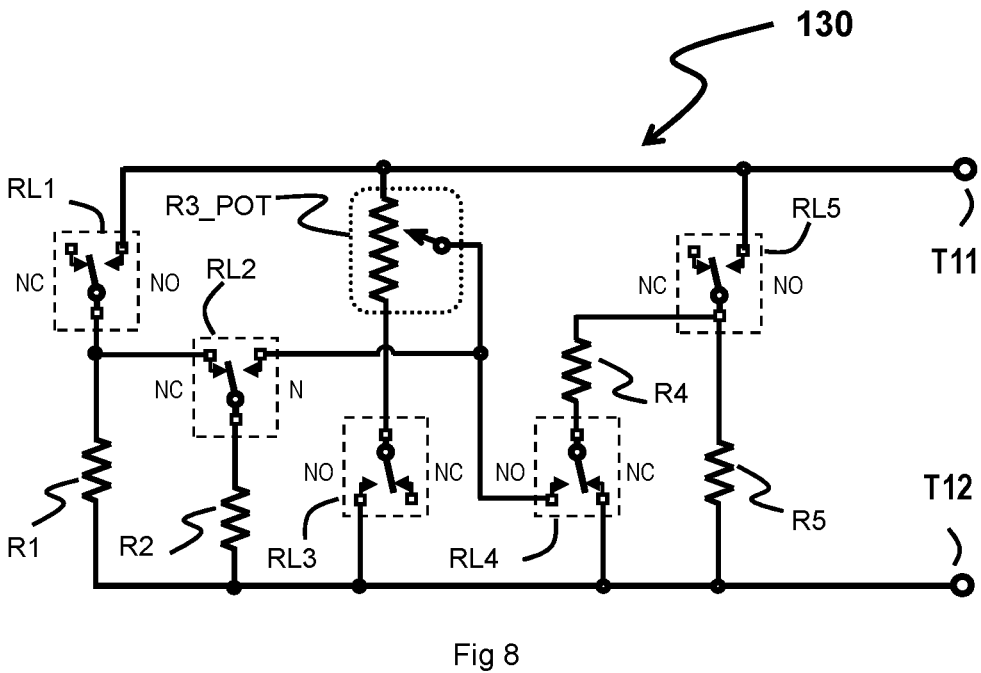

FIG. 8 schematically illustrates an alternate embodiment of the improved load bank system circuit/topology with a potentiometer.

Figure 9:
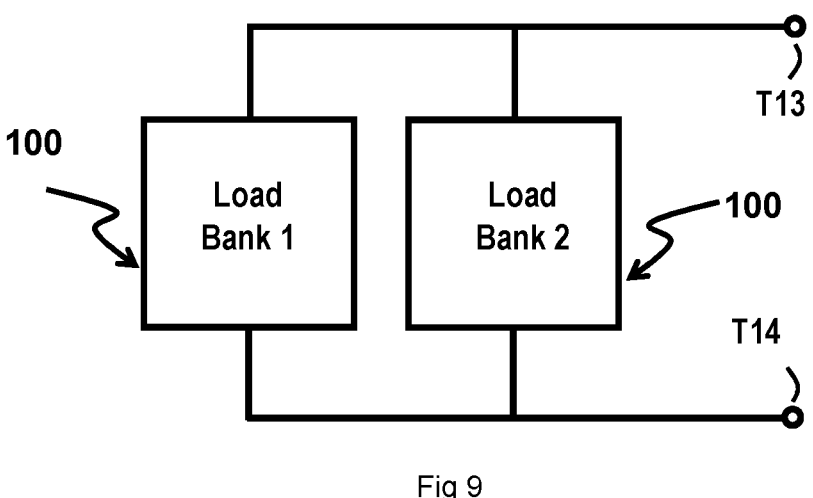

FIG. 9 shows cascading of two load banks of the present invention for generating very large number of loading steps.

Figure 10:
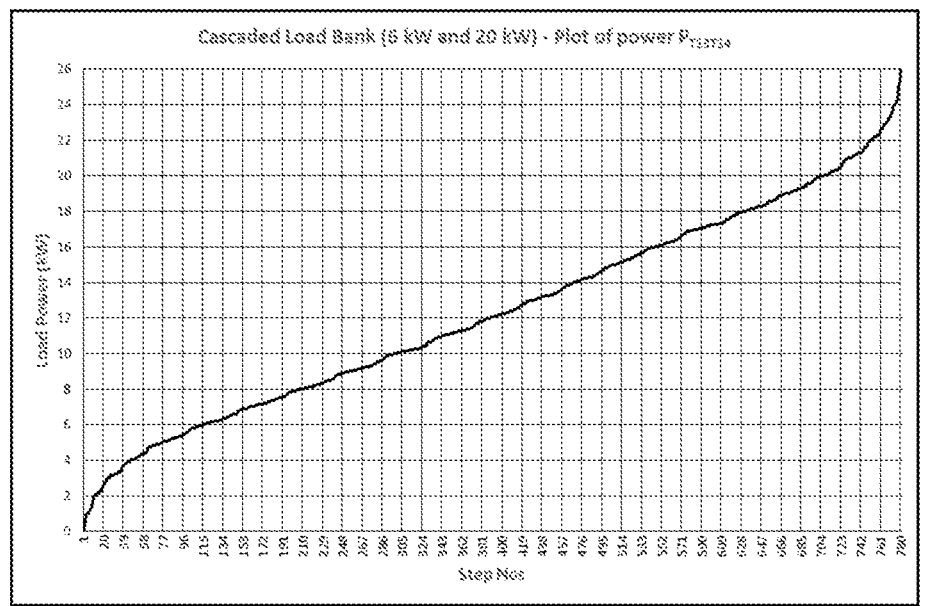

FIG. 10 shows the plot of power loading steps generated by the cascaded load bank shown in FIG. 9.

Figure 11:
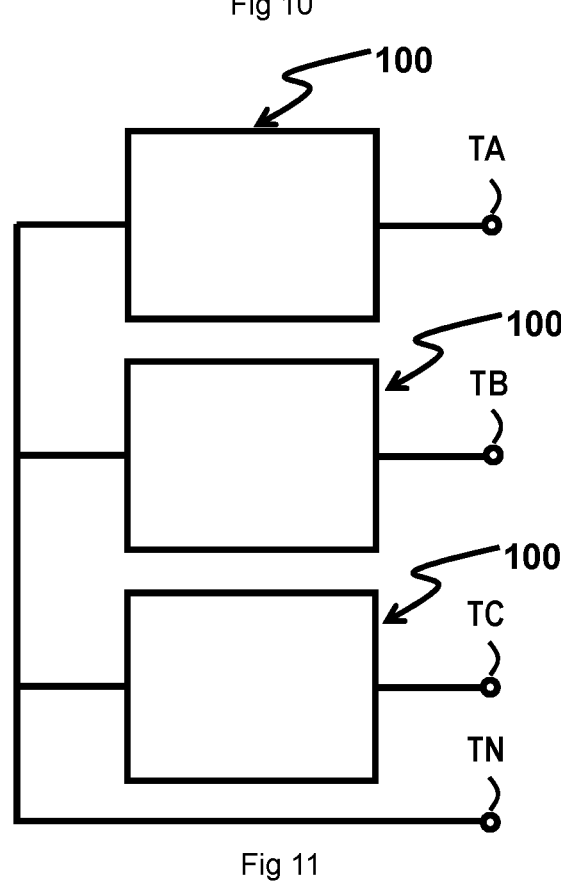

FIG. 11 Shows the Star connected three phase load bank made using the load bank system circuit/topology of the present invention.

Figure 12:
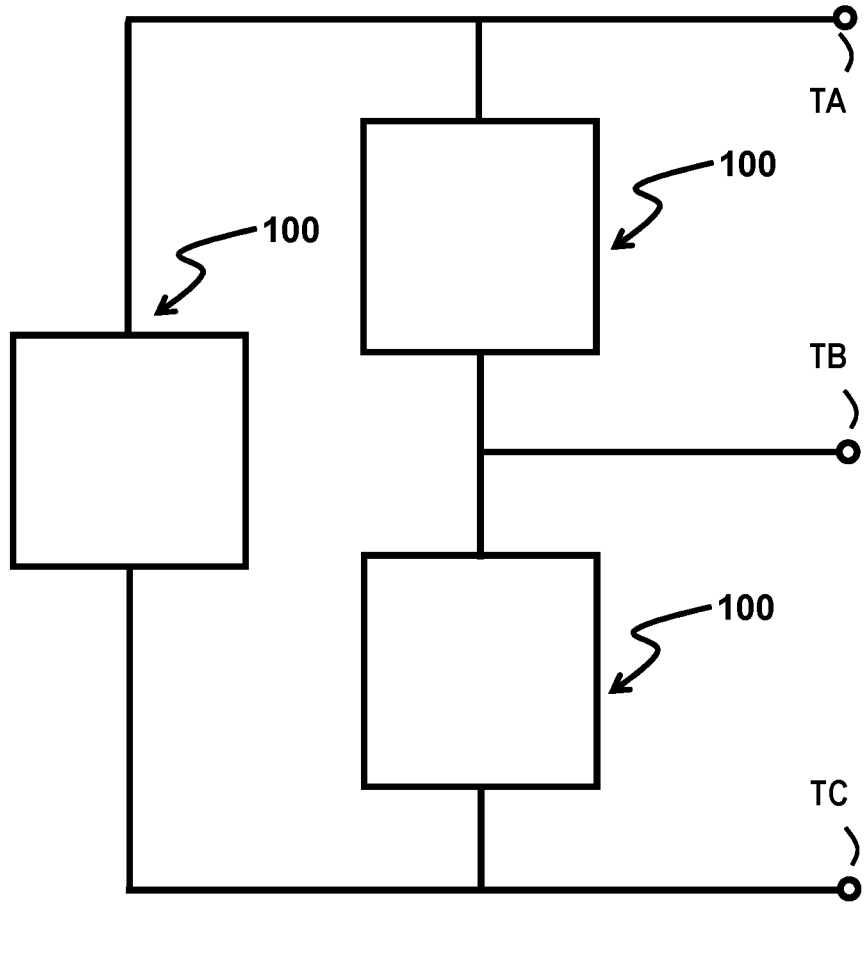

FIG. 12 Shows the Delta connected three phase load bank made using the load bank system circuit/topology of the present invention.

FIG. 13 is a table that depicts various combinations of R3A and R3B tried for load bank system of Sr. No. 1 of table 4.

FIG. 14 and FIG. 15 combined is a table that depicts detailed analysis for the load bank system circuit/topology of Sr. No. 12 (16 kW) of Table 4.

DETAILED DESCRIPTION OF THE INVENTION

The foregoing objects of the present invention are accomplished and the problems and shortcomings associated with the prior art, techniques and approaches are overcome by the present invention as described below in the preferred embodiments.

The present invention is a load bank system circuit topology and method thereof, to generate large number of discrete loading steps.

In the following description, for the purpose of explanation, specific details are set forth in order to provide an understanding of the present invention. It will be apparent, however, to one skilled in the art that the present invention may be practiced without these details. One skilled in the art will recognize that embodiments of the present invention, some of which are described below, may be incorporated into a number of systems.

The various embodiments of the present invention provide a load bank system circuit topology and method thereof, to generate large number of discrete loading steps.

Furthermore, connections between components and/or modules within the figures are not intended to be limited to direct connections. Rather, these components and modules may be modified, re-formatted or otherwise changed by intermediary components and modules.

The systems/device and methods described herein are explained using examples with specific details for better understanding. However, the disclosed embodiments can be worked on by a person skilled in the art without the use of these specific details.

Throughout this application, references in the present invention to "one embodiment" or "an embodiment" mean that a particular feature, structure, characteristic, or function described in connection with the embodiment is included in at least one embodiment of the invention. The appearances of the phrase "in one embodiment" in various places in the specification are not necessarily all referring to the same embodiment.

Embodiments of the present invention include various steps, which will be described below. The steps may be performed by hardware components or may be embodied in machine-executable instructions, which may be used to cause a general-purpose or special purpose processor programmed with the instructions to perform the steps. Alternatively, steps may be performed by a combination of hardware, software, firmware and/or by human operators.

If the specification states a component or feature "may' can", "could", or "might" be included or have a characteristic, that particular component or feature is not required to be included or have the characteristic.

As used in the description herein and throughout the claims that follow, the meaning of "a, an," and "the" includes plural reference unless the context clearly dictates otherwise. Also, as used in the description herein, the meaning of "in" includes "in" and "on" unless the context clearly dictates otherwise.

Exemplary embodiments will now be described more fully hereinafter with reference to the accompanying drawings, in which exemplary embodiments are shown. This invention may, however, be embodied in many different forms and should not be construed as limited to the embodiments set forth herein. These embodiments are provided so that this invention will be thorough and complete and will fully convey the scope of the invention to those of ordinary skill in the art. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Hereinafter, embodiments will be described in detail. For clarity of the description, known constructions and functions will be omitted. Parts of the description may be presented in terms of operations performed by an Electrical/Electronic system, using terms such as load, link, ground, fault, switch and the like, consistent with the manner commonly employed by those skilled in the art to convey the substance of their work to others skilled in the art. As is well understood by those skilled in the art, these quantities take the form of electrical, magnetic signals capable of being stored, transferred, combined, and otherwise manipulated through mechanical and electrical components of the electronic/electrical systems.

While embodiments of the present invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claim.

of the resistor R3 and divide the resistor into parts, at least two terminals, terminal T5, terminal T6 for connecting the load bank to a power source under test, to generate a large number of loading steps. The system and method there of the present invention generate a large number of loading steps when the resistors used for the load bank system are all single value resistors (resistors with identical values, which is also the base resistance power) or when the resistors used for the load bank system are multi value resistors (resistors with at least two different power values), the large number of loading steps having minimum number of duplicate loading steps, minimum number of high power difference loading steps, high maximum to minimum load ratio and lowest value average resolution of the loading step. According to one of the implementation of the system and method there of the present invention, a load bank with single value resistors is a preferred embodiment. Further, according to one of the implementation of the system and method there of the present invention the load bank power can be lower than the base resistance power i.e. the load bank can generate loading power which is smaller than the base resistance power.

Referring now to FIG. 1, there is reproduced a prior art block diagram of resistor banks of a load calculation control apparatus (10) by Matsumoto. It mainly consists of eight ON/OFF switches (CL), and eight load resistors ($\alpha 1$ to $\alpha 8$).

Further, referring to FIG. 2, in FIG. 2, circuit diagram of prior art resistor bank of FIG. 1 has been redrawn. This Prior Art circuit diagram (20) consists of five switches (CL1 to CL5) and five load resistors ($\alpha 1$ to $\alpha 5$). First terminal of switches CL1, CL2, CL3, CL4 and CL5 are connected to the load bank terminal T1. The second terminals of switches CL1, CL2, CL3, CL4 and CL5 are connected to the first terminals of load resistors $\alpha 1$, $\alpha 2$, $\alpha 3$, $\alpha 4$, and $\alpha 5$. The second terminals of load resistors $\alpha 1$, $\alpha 2$, $\alpha 3$, $\alpha 4$, and $\alpha 5$ are connected to the load bank terminal T2. The Table 1 shows the examples of load value calculations for prior art resistor bank (20).

TABLE 1

| Sr. No | Load α1 (kW) | Load α2 (kW) | Load α3 (kW) | Load α4 (kW) | Load α5 (kW) | Load $\alpha_{T1T2}$ (kW) | MAX/ MIN Ratio | No of Steps (Nos) | MAX Reso (kW) | Av. Reso (kW) | Missing Step (kW) |
|---|---|---|---|---|---|---|---|---|---|---|---|
| 1 | 1 | 1 | 1 | 1 | 1 | 5 | 5 | 5 | 1 | 1.00 | |
| 2 | 1 | 1 | 1 | 1 | 2 | 6 | 6 | 6 | 1 | 1.00 | |
| 3 | 1 | 1 | 1 | 2 | 2 | 7 | 7 | 7 | 1 | 1.00 | |
| 4 | 1 | 1 | 2 | 2 | 2 | 8 | 8 | 8 | 1 | 1.00 | |
| 5 | 1 | 2 | 2 | 2 | 2 | 9 | 9 | 9 | 1 | 1.00 | |
| 6 | 1 | 1 | 2 | 2 | 4 | 10 | 10 | 10 | 1 | 1.00 | |
| 7 | 1 | 2 | 2 | 2 | 4 | 11 | 11 | 11 | 1 | 1.00 | |
| 8 | 1 | 1 | 2 | 4 | 4 | 12 | 12 | 12 | 1 | 1.00 | |
| 9 | 1 | 2 | 2 | 4 | 4 | 13 | 13 | 13 | 1 | 1.00 | |
| 10 | 1 | 1 | 2 | 2 | 8 | 14 | 14 | 13 | 2 | 1.08 | 7 |
| 11 | 1 | 2 | 4 | 4 | 4 | 15 | 15 | 15 | 1 | 1.00 | |
| 12 | 1 | 1 | 2 | 4 | 8 | 16 | 18 | 16 | 1 | 1.00 | |
| 13 | 1 | 2 | 2 | 4 | 8 | 17 | 17 | 17 | 1 | 1.00 | |
| 14 | 1 | 1 | 4 | 4 | 8 | 18 | 18 | 17 | 2 | 1.06 | 3 |
| 15 | 1 | 2 | 4 | 4 | 8 | 19 | 19 | 19 | 1 | 1.00 | |
| 16 | 1 | 1 | 2 | 8 | 8 | 20 | 20 | 19 | 2 | 1.05 | 5 |
| 17 | 1 | 2 | 4 | 8 | 18 | 31 | 31 | 31 | 1 | 1.00 | |

The present invention provides a load bank system circuit topology and method thereof, to generate large number of discrete loading steps. The system and method there of employs at least five switches RL1, RL2, RL3, RL4, RL5, at least five resistors R1, R2, R3, R4, R5, the R3 a special tap resistor having at least one tap movable along the length In Table 1, example calculations are given for load values generated for the circuit diagram of prior art resistor bank. In column 2, 3, 4, 5 and 6, selected power ratings for load resistors $\alpha 1$, $\alpha 2$, $\alpha 3$, $\alpha 4$, and $\alpha 5$ are entered. Column 7 captures the maximum load power $\alpha_{T1T2}$ which is generated when all 5 switches CL1 to CL5 are turned ON. Intermediate load power values in steps of 1 kW are generated by setting switches CL1 to CL5 in ON or OFF state.

Serial No. 1 of the Table 1 is the simplest case, in which all five load resistors ($\alpha1$ to $\alpha5$) are having same power rating of 1 kW each. Referring to FIG. 2, if switch CL1 is turned ON, the load value $\alpha_{T1T2}$ at terminals T1-T2 will be 1 kW. If two switches CL1 and CL2 are turned ON, then the load power $\alpha_{T1T2}$ will be 2 kW and so on. Thus for this example, one get 5 steps of 1 kW each. The ratio of Maximum load power to Minimum load power is 5. The resolution in this case is 1 kW. There are no missing steps.

Now considering the serial no 10 of the Table 1, having total load of 14 kW. It consists of loads $\alpha1=1$, $\alpha2=1$, $\alpha3=2$, $\alpha4=2$, $\alpha5=8$. This combination can generate following power loading steps:

1, (CL1 ON)
2, (CL3 ON)
3=(1+2), (CL1 and CL3 ON)
4=(2+2), (CL3 and CL4 ON)
5=(1+2+2), (CL1, CL3 and CL4 ON)
6=(1+1+2+2), (CL1, CL2, CL3 and CL4 ON)
7 (Missing step),
8, (CL5 ON)
9=(1+8), (CL1 and CL5 ON)
10=(2+8), (CL3 and CL5 ON)
11=(1+2+8), (CL1, CL3, CL5 ON)
12=(2+2+8), (CL3, CL4, CL5 ON)
13=(1+2+2+8), (CL1, CL3, CL4, CL5 ON)
14=(1+1+2+2+8). (All CLs ON)

Table 2 gives equations and calculations for the prior art load bank topology (50). Table 2, columns 2, 3, 4 and 5 show the ON/OFF status of switches. Column 6 gives the equations for equivalent resistance ($R_{T3T4}$) at load bank terminals T3 and T4. Column 7 gives the multiplication/division factors to calculate the $R_{T3T4}$ for the values of resistors as given below:

$$Ra=Rb=Rc=Rd=Re=R=1000 \ \Omega$$

Column 8 gives values of $R_{T3T4}$ for the respective switch combinations. In the last column, load power values ($P_{T3T4}$) have been calculated for voltage level of V=1000 Volts.

$$P_{T3T4} = V * V / R_{T3T4} = (1000 * 1000)/R_{T3T4} \, W$$

In terms of kW the equation becomes $$P_{T3T4} = (1000/R_{T3T4}) \text{kW}$$

At 1000 V, power rating of 1000$\Omega$ resistors is 1 kW each. From the table 2 it is observed that, this topology provides 12 load power steps. The ratio of Maximum power to Minimum power is =4/0.5=8

TABLE 2

| Sr No | SW1 | J1 | J2 | SW2 | Equations for Equivalent Resistance at T3-T4 | Factor | Res $R_{T3T4}$ ($\Omega$) | Load $P_{T3T4}$ (kW) |
|---|---|---|---|---|---|---|---|---|
| 1 | OFF | ON | OFF | OFF | Rc + Re | R/0.5 | 2000 | 0.50 |
| 2 | OFF | OFF | OFF | OFF | Rc + {(Rb + Rd) ‖ Re} | R/0.6 | 1667 | 0.60 |
| 3 | OFF | OFF | ON | OFF | Rc + {Rd ‖ Re} | R × 1.5 | 1500 | 0.67 |
| 4 | OFF | ON | OFF | ON | Re | R/1 | 1000 | 1.00 |
| 5 | OFF | OFF | OFF | ON | Re ‖ (Rb + Rd) | R/1.5 | 666.7 | 1.50 |
| 6 | ON | OFF | OFF | OFF | Ra ‖ {Rc + (Re ‖ (Rb + Rd))} | R/1.6 | 625 | 1.60 |
| 7 | ON | OFF | ON | OFF | Ra ‖ {Rc + (Rd ‖ Re)} | R × 0.6 | 600 | 1.67 |
| 8 | OFF | OFF | ON | ON | Rd ‖ Re | R/2 | 500 | 2.00 |
| 9 | ON | ON | OFF | OFF | (Ra ‖ Rb) ‖ (Rc + Re) | R/2.5 | 400 | 2.50 |
| 10 | ON | ON | ON | OFF | (Ra ‖ Rb) ‖ {Rc + (Rd ‖ Re)} | R × 0.375 | 375 | 2.67 |
| 11 | ON | ON | OFF | ON | Ra ‖ Rb ‖ Re | R/3 | 333.3 | 3.00 |
| 12 | ON | ON | ON | ON | Ra ‖ Rb ‖ Rd ‖ Re | R/4 | 250 | 4.00 |

In the above example, 7 kW step cannot be generated (missing step). The MAX/MIN ratio is 14, and number of steps is 13. Therefore the Max resolution is 2 kW and average resolution is 1.08 kW.

For serial nos. 14 and 16 of the Table 1 also, there is one missing step. For remaining all rows, all load values are generated in steps of 1 kW.

In Table 1, Combinations beyond 16 kW are not considered as there are missing steps. The last serial no 17, is a special case. This is the combination which uses the binary values of 1, 2, 4, 8 and 16 as described by Matsumoto. It provides 31 steps ($2^5-1$) without any missing step. Table 1, provides few example calculations. Many more combinations are possible which are not covered in Table 1.

Referring to FIG. 3, the FIG. 3 shows a prior art resistor load bank topology (50). This topology was published in Electronic Design magazine (Jul. 21 2020). It consists of four switches SW1, SW2, J1 and J2. Switch SW1 is simple ON/OFF switch, remaining three switches are single pole double throw (SPDT) type switches. Also uses five resistors Ra, Rb, Rc, Rd and Re.

The present invention provides a load bank system circuit topology and method thereof, to generate large number of discrete loading steps. According to one of the embodiment of the present invention, a load bank system for generating large number of discrete loading steps, comprises at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test. The load bank system is constituted through a circuit topology in which a pole terminal of the RL1 is electrically coupled to a first terminal of the resistor R1 and to a NC (Normally Closed) terminal of the RL2, a NC terminal of the RL1 is left open and a NO (Normally Open) terminal of the RL1 is electrically coupled to the terminal T5 of the load bank. Further, a pole terminal of the RL2 is electrically coupled to a first terminal of the resistor R2. According to the load bank system circuit of the present invention a first terminal of the resistor R3 is electrically coupled to the T5 terminal of load bank, a second terminal of the resistor R3 is electrically coupled to a pole terminal of the RL3, the Tap of R3 is moved to a desired location on the resistor R3 and is fixed to divide the resistor R3 in parts, and the Tap is electrically coupled to a NO terminal of RL2 and a NO terminal of RL4. Further, a pole terminal of RL4 is electrically coupled to a first terminal of R4, a second terminal of R4 is electrically coupled to a pole terminal of RL5. Further, in the load bank system circuit of the present invention a first terminal of R5 is electrically coupled to a pole terminal of RL5, a NO terminal of RL5 is electrically coupled to the terminal T5 of load bank, and a NC terminal of RL5 is left open. Consequently, a second terminal of R1, a second terminal of R2 and a second terminal of R5 are electrically coupled to the terminal T6 of the load bank, and a NO terminal of RL3 and a NC terminal of RL4 are electrically coupled to the terminal T6. The relay switches of the load bank system can be operated through control mechanism. The control mechanism for operating the relay switches of the load bank system can be custom designed control mechanism or control mechanism that is presently known in the art.

According to one of the embodiment of the present invention, a load bank system for generating large number of discrete loading steps is constituted to provide at least one operative combination of the plurality of switches that generates load bank off condition (zero load step).

In an implementation according to one of the embodiment the resistor R3 is a special resistor having at least one tap. The tap of the resistor R3 is moved to the desired location on the resistor R3 and is fixed, thus dividing the resistor R3 into a plurality of sections. The desired location of the tap on the resistor R3 is determined as the splitting spot on the resistor R3 splitting the resistor R3 in to the plurality of sections such that upon operating the plurality of switches through various
combinations, the load bank system generates maximum number of discrete loading steps, minimum number of duplicate loading steps and generates minimum number of high power difference loading steps. The power rating of the resistor R3 is always the base resistance power value of the load bank, for example the 1 kW. Further, in an implementation a loading step is considered as high power difference loading step when difference in the effective power of the previous loading step and the loading step under consideration is greater than 50% of the base resistance power value of the load bank, for example 500 W. Here the values of 1 kW and 500 W are given as exemplary values. However, any other values can be selected as base resistance power value.

The resistor R3 having one tap, is divided by the tap into two sections, the section of resistor between the first terminal of R3 and tap is R3A and section of resistor between tap and second terminal of R3 is R3B. The resistor R3 of the system can be a tap resistor having one or more taps or a potentiometer.

In an implementation according to one of the embodiment the load bank system have one tap at the tap resistor R3 to provide excluding at least one zero load (load bank off condition) step, at least 31 loading steps including at least 27 unique value loading steps, and not more than 4 repetitive value loading steps, thus in total 32 loading steps. These numbers are for system with all identical resistors. For system with at least two different resistor values, the number of unique value loading steps increases and repetitive value loading steps reduces.

According to one another embodiment of the present invention, the system is constituted and configured to have more than one tap at the tap resistor R3 and an additional switch RL6, the RL6 being single pole double throw (SPDT) switch or rotary switch (RSW), to increase the number of loading steps provided by the system, more than 32 loading steps including at least one zero load (load bank off condition) step.

In an implementation according to one of the embodiment the plurality of switches of the load bank system are operated in possible combination to generate the plurality of loading steps. Upon operating the plurality of switches through various combinations, the load bank system generates large number of loading steps when the resistors used for the load bank system are single value resistors (all resistors with identical values) as well as the resistors used for the load bank system are multi value resistors (resistors with at least two different values). The plurality of switches can be relays, or single pole double throw (SPDT) switches, or contactors or SPDT solid state switches or any other similar devices.

The load bank system is constituted and configured to provide high maximum to minimum load ratio and lowest value average resolution of the loading step. The plurality of load bank systems can be cascaded to provide very high number of loading steps. The plurality of load bank systems can be connected as star connected load bank or delta connected load bank for using in 3 phase application.

According to one of the embodiment of the present invention a method for a load bank system for generating large number of loading steps includes providing, a load bank system for generating large number of loading steps having at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test. The step of providing, a load bank system for generating large number of loading steps includes electrically coupling a pole terminal of the RL1 to a first terminal of the resistor R1 and to a NC (Normally Closed) terminal of the RL2, leaving open a NC terminal of the RL1, and electrically coupling a NO (Normally Open) terminal of the RL1 to the terminal T5 of the load bank. The step of providing, a load bank system for generating large number of loading steps includes electrically coupling a pole terminal of the RL2 to a first terminal of the resistor R2. The step of providing, a load bank system for generating large number of loading steps includes electrically coupling a first terminal of the resistor R3 to the T5 terminal of load bank, electrically coupling a second terminal of the resistor R3 to a pole terminal of the RL3, moving the Tap of R3 to a desired location on the resistor R3 and fixing it to divide the resistor R3 in parts/sections, electrically coupling the Tap to a NO terminal of RL2 and a NO terminal of RL4. The step of providing, a load bank system for generating large number of loading steps further includes electrically coupling a pole terminal of
RL4 to a first terminal of R4 and electrically coupling a second terminal of R4 to a pole terminal of RL5. Further, the step of providing, a load bank system for generating large number of loading steps includes electrically coupling a first terminal of R5 to a pole terminal of RL5, electrically coupling a NO terminal of RL5 to the terminal T5 of load bank, and leaving open a NC terminal of RL5.
Consequently, the step of providing, a load bank system for generating large number of loading steps includes electrically coupling a second terminal of R1, a second terminal of R2 and a second terminal of R5 to the terminal T6 of the load bank and electrically coupling a NO terminal of RL3 and a NC terminal of RL4 to the terminal T6. Further, the method for a load bank system for generating large number of loading steps includes connecting, the load bank system to a power source under test through the two terminals, terminal T5, and terminal T6. Further, the method for a load bank system for generating large number of loading steps includes operating, the plurality of switches in possible combination to generate the plurality of loading steps. The relay switches of the load bank system can be operated through control mechanism. The control mechanism for operating the relay switches of the load bank system can be custom designed control mechanism or control mechanism that is presently known in the art.

According to one of the embodiment of the present invention, a method for load bank system for generating large number of loading steps provides at least one operative combination of the plurality of switches that generates load bank off condition (zero load step).

In an implementation according to one of the embodiment of the present invention the method includes moving at least one tap that resistor R3 has, to the desired location on the resistor R3 and fixing it, dividing the resistor R3 into a plurality of sections. The method includes determining the desired location of the tap on the resistor R3 as the splitting spot on the resistor R3 splitting the resistor R3 in to the plurality of sections such that maximum number of discrete loading steps, minimum number of duplicate loading steps are generated and minimum number of high power difference loading steps are generated. The method includes considering a loading step as high power difference loading step when difference in the effective power of the previous loading step and the loading step under consideration is greater than 50% of the base resistance power value of the load bank. The method includes always having the load value of the resistor R3 as the base resistance power value of the load bank, in a preferred example the 1 kW.

In an implementation according to one of the embodiments of the present invention the method includes the tap resistor R3 having one tap to provide at least 31 loading steps including at least 27 unique value loading steps, not more than 4 repetitive value loading steps and excluding at least one zero load (load bank off condition) step. These numbers are for system with all identical resistors. For system with at least two different resistor values, the number of unique value loading steps increase and repetitive value loading steps reduce.

In one another implementation according to one of the embodiments of the present invention the method includes the resistor R3 having more than one tap and an additional switch RL6, the RL6 being single pole double throw (SPDT) switch or rotary switch (RSW), to increase the number of loading steps provided by the system, more than 32 loading steps including at least one zero load (load bank off condition) step.

The method further includes the resistor R3 as a tap resistor having one or more taps or a potentiometer.

The method further includes operating the plurality of switches in possible combination to generate the plurality of loading steps. The method includes generating upon operating the plurality of switches through various combinations large number of loading steps when the resistors used for the load bank system are single value resistors (all resistors with identical values) or the resistors used for the load bank system are multi value resistors (resistors with at least two different values).

The method further includes the plurality of switches as relays, or single pole double throw (SPDT) switches, or contactors or SPDT solid state switches or any other similar devices.

In an implementation according to one of the embodiments of the present invention the method includes providing high maximum to minimum load ratio and lowest value average resolution of the loading step.

Referring to FIG. 4, the FIG. 4 schematically illustrates a load bank system circuit diagram/topology (100) for generating large number of loading steps according to the present invention. The load bank system circuit diagram/topology (100) comprises at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test and at least five switches such as SPDT relay switches (herein after referred as relays) RL1, RL2, RL3, RL4 and RL5. Alternatively, in place of these relays, SPDT switches, Contactors or SPDT solid state switches or any other similar devices can also be used.

In an implementation, according to one of the embodiment of the present invention the load bank system circuit/topology (100) is constituted and configured to generate large number of loading steps through construction as illustrated in FIG. 4 and described herewith. As illustrated in the FIG. 4, the pole terminal of RL1 is connected to the first terminal of resistor R1 and also to the NC (Normally Closed) terminal of RL2. The NC terminal of RL1 has been left open. The NO (Normally Open) terminal of RL1 is connected to the terminal T5 of the load bank. Further, the pole terminal of RL2 is connected to the first terminal of resistor R2. The first terminal of R3 is connected to the T5 terminal of load bank. The second terminal of R3 is connected to pole terminal of relay RL3. The resistor R3 is a special resistor. It has a tapping (Tap) which can be moved along the length of the resistor. The Tap is moved to the desired location on the resistor and then it is fixed. Tap divides the resistor R3 in two parts. The section of resistor between first terminal of R3 and Tap is labeled as R3A. The section of resistor between Tap and second terminal of R3 is labeled as R3B. The total value of resistor R3 remain unaltered even with having at least one tap. There is no change in the resistance value of R3, which is given by the following equation:

$$R3 = R3A + R3B$$

Thus the Tap is used to change the ratio R3A/R3B. The desired location of the tap on the resistor R3 is determined as the splitting spot on the resistor R3 splitting the resistor R3 in to the plurality of sections such that minimum number of duplicate loading steps are generated and minimum number of high power difference loading steps are generated. For a given design of load bank, once the Tap location is fixed, it remains fixed throughout the life of the load bank so that large number of discrete loading steps having minimum number of duplicate loading steps, minimum number of high power difference loading steps, high maximum to minimum load ratio and lowest value average resolution of the loading step is attended. Further, Tap is connected to NO terminals of RL2 and RL4. The pole terminal of RL4 is connected to first terminal of R4. The second terminal of R4 is connected to pole terminal of RL5. In addition, the first terminal of R5 is connected to the pole terminal of RL5. The NO terminal of RL5 is connected to the terminal T5 of load bank. The NC terminal of RL5 has been left open. Lastly, the second terminals of R1, R2 and R5 are connected to terminal T6 of the load bank. The NO terminal of RL3 and NC terminal of RL4 are also connected to terminal T6. Terminals T5 and T6 are used for connecting the load bank to the power source under test. The relay switches of the load bank system can be operated through control mechanism (not shown in the FIG. 4 or any other diagram). The control mechanism for operating the relay switches of the load bank system can be custom designed control mechanism or control mechanism that is presently known in the art.

Table 3 gives the equations for equivalent resistance at load bank terminals T5 and T6 derived through electrical network analysis for load bank system (100) of the present invention illustrated in FIG. 4.

resistors. For example, (R1‖R2) indicates that R1 is in parallel with R2. The expression for equivalent resistance is:

$$(R1\|R2) = (R1 \times R2)/(R1 + R2)$$

For an exemplary analysis of the equivalent resistance at load bank terminals T5 and T6 in various combinations of condition status of the plurality of relay switch such as RL1, RL2, RL3, RL4 and RL5 consider Sr. No 1 of table 3, where all relays are in OFF condition (not energized). In this case, the pole terminal of all the relays are connected to the NC terminal. (This is the condition shown in FIG. 4). All the resistors are open and the terminals T5 and T6 are open and the load power is zero. This is the off condition for the load bank.

Now Considering Sr. No. 3 of table 3, where RL2 is ON and remaining relays are OFF. According to the load bank

TABLE 3

| Sr. No | RL1 | RL2 | RL3 | RL4 | RL5 | Eq Resistance at T5 & T6 ($R_{T5T6}$) |
|---|---|---|---|---|---|---|
| 1 | OFF | OFF | OFF | OFF | OFF | OPEN |
| 2 | OFF | OFF | OFF | ON | OFF | R4 + R3A + R5 |
| 3 | OFF | ON | OFF | OFF | OFF | R3A + R2 |
| 4 | OFF | ON | OFF | ON | OFF | R3A + {R2 ‖ (R4 + R5)} |
| 5 | OFF | OFF | OFF | ON | ON | R5 |
| 6 | ON | ON | OFF | OFF | OFF | R1 ‖ {R3A + R2} |
| 7 | ON | ON | OFF | ON | OFF | R1 ‖ {R3A + (R2 ‖ (R4 + R5))} |
| 8 | OFF | ON | OFF | ON | ON | R5 ‖ {R2 + (R4 ‖ R3A)} |
| 9 | OFF | OFF | OFF | OFF | ON | R4 ‖ R5 |
| 10 | ON | OFF | OFF | OFF | OFF | R1 ‖ R2 |
| 11 | ON | OFF | OFF | ON | OFF | (R1 ‖ R2) ‖ (R4 + R3A + R5) |
| 12 | OFF | ON | OFF | OFF | ON | R4 ‖ R5 ‖ (R2 + R3A) |
| 13 | ON | ON | OFF | ON | ON | R1 ‖ R5 ‖ {R2 + (R4 ‖ R3A)} |
| 14 | ON | OFF | OFF | ON | ON | R1 ‖ R2 ‖ R5 |
| 15 | ON | ON | OFF | OFF | ON | R1 ‖ R4 ‖ R5 ‖ (R2 + R3A) |
| 16 | ON | OFF | OFF | OFF | ON | R1 ‖ R2 ‖ R4 ‖ R5 |
| 17 | OFF | OFF | ON | ON | OFF | R3A + {R3B ‖ (R4 + R5)} |
| 18 | OFF | ON | ON | OFF | OFF | R3A + (R2 ‖ R3B) |
| 19 | OFF | ON | ON | ON | OFF | R3A + {(R2 ‖ R3B) ‖ (R4 + R5)} |
| 20 | OFF | OFF | ON | ON | ON | R5 ‖ {(R4 ‖ R3A) + R3B} |
| 21 | ON | ON | ON | OFF | OFF | R1 ‖ {(R2 ‖ R3B) + R3A} |
| 22 | ON | ON | ON | ON | OFF | R1 ‖ {R3A + ((R2 ‖ R3B) ‖ (R4 + R5))} |
| 23 | OFF | ON | ON | ON | ON | R5 ‖ {(R2 ‖ R3B) + (R4 ‖ R3A)} |
| 24 | OFF | OFF | ON | OFF | ON | R4 ‖ R5 ‖ (R3A + R3B) |
| 25 | ON | OFF | ON | OFF | OFF | R1 ‖ R2 ‖ (R3A + R3B) |
| 26 | ON | OFF | ON | ON | OFF | R1 ‖ R2 ‖ {R3A + (R3B ‖ (R4 + R5))} |
| 27 | OFF | ON | ON | OFF | ON | R4 ‖ R5 ‖ {R3A + (R2 ‖ R3B)} |
| 28 | ON | ON | ON | ON | ON | R1 ‖ R5 ‖ {(R2 ‖ R3B) + (R4 ‖ R3A)} |
| 29 | ON | OFF | ON | ON | ON | R1 ‖ R2 ‖ R5 ‖ {R3B + (R4 ‖ R3A)} |
| 30 | ON | ON | ON | OFF | ON | R1 ‖ R4 ‖ R5 ‖ {R3A + (R2 ‖ R3B)} |
| 31 | ON | OFF | ON | OFF | ON | R1 ‖ R2 ‖ R4 ‖ R5 ‖ (R3A + R3B) |
| 32 | OFF | OFF | ON | OFF | OFF | R3A + R3B |

According to implementation of one of the embodiment of the present invention Table 3 gives the equations for an equivalent resistance at load bank terminals T5 and T6 for various combinations of condition status of the plurality of relay switch such as RL1, RL2, RL3, RL4 and RL5. In columns 2, 3, 4, 5 and 6 the ON/OFF status of relays RL1, RL2, RL3, RL4 and RL5 respectively is given. According to the implementation for five relays there are 32 combinations. The Seventh column gives the equations for calculating the equivalent resistance $R_{T5T6}$. Notation "‖" indicates the parallel combination of system circuit/topology illustrated in FIG. 4, in the condition depicted in Sr. No. 3, where RL2 is ON and remaining relays are OFF, the terminal T5 is connected to R3. Then, the R3 from its Tap through NO contact of RL2 is connected to R2. Hence the equivalent resistance is given by $$R_{T5T6} = (R3A + R2)$$

Further, for another exemplary analysis, consider Sr. No. 9 of table 3, where RL5 is ON, remaining all relays are OFF. Looking at FIG. 4, it is seen that, resistances R4 and R5 are in parallel i.e. (R4‖R5). This parallel combination appears across terminals T5 and T6.

$$R_{T5T6} = (R4‖R5) = (R4 \times R5)/(R4 + R5)$$

On similar lines, all the equations have been derived. As explained earlier, for Voltage V=1000 volts, power in kW can be calculated as follows:

$$P_{T5T6} = (1000/R_{T5T6})kW$$

Table 4 shows the detailed calculations for the load bank system circuit/topology (100) illustrated in FIG. 4 according to implementation of one of the embodiment of the present invention. The base value for Table 4 is 1 kW. The resistance R3 is maintained at base value.

R3B=300Ω. These values have been arrived after trying out different combinations of R3A and R3B for load bank system of Sr. No. 1 of table 4. The combination which gives maximum number of discrete steps, minimum number of duplicate loading steps, and minimum number of high power difference loading steps, is selected. The Table 6 reproduced as FIG. 13 depicts various combinations of R3A and R3B tried for load bank system of Sr. No. 1 of table 4. In the Table 6 the duplicate steps are highlighted in grey, the high power difference loading steps are highlighted in black with white font. As depicted in the table 6 the combination of values R3A=700Ω, and R3B=300Ω for load bank system of Sr. No. 1 of table 4 provides maximum discrete steps i.e. 27 discrete steps with only one high power difference loading step, minimum duplicate loading steps i.e. 04 duplicate steps, excluding the off condition for the load bank. Being this the best scenario, the Tap on resistor R3 has been fixed so as to get R3A=700Ω, and R3B=300Ω.

The values in Table 4, for all rows have been finalized after several trials. Even though 31 values are generated for $R_{T5T6}$ as there are 31 equations (Table 3), some values get duplicated. The trials are run to find out which combination

TABLE 4

| Sr. No | Load 1 (kW) | Load 2 (kW) | Load 3 (kW) | Load 4 (kW) | Load 5 (kW) | Load $P_{T5T6}$ (kW) | MAX/ MIN Ratio | No of Steps (Nos) | MAX Reso (kW) | Av. Reso (kW) | Missing Step (kW) |
|---|---|---|---|---|---|---|---|---|---|---|---|
| 1 | 1 | 1 | 0.7 + 0.3 | 1 | 1 | 5 | 13.5 | 27 | 0.60 | 0.19 | |
| 2 | 1 | 1 | 0.8 + 0.2 | 1 | 2 | 6 | 13.8 | 29 | 0.53 | 0.21 | |
| 3 | 1 | 2 | 0.1 + 0.9 | 1 | 2 | 7 | 11.2 | 29 | 0.63 | 0.24 | |
| 4 | 2 | 2 | 0.8 + 0.2 | 1 | 2 | 8 | 18.4 | 30 | 0.94 | 0.27 | |
| 5 | 2 | 2 | 0.8 + 0.2 | 2 | 2 | 9 | 16.2 | 29 | 1.00 | 0.31 | |
| 6 | 1 | 4 | 0.275 + 0.725 | 2 | 2 | 10 | 12.7 | 30 | 1.00 | 0.33 | |
| 7 | 2 | 4 | 0.2 + 0.8 | 2 | 2 | 11 | 13.2 | 30 | 1.00 | 0.37 | |
| 8 | 1 | 2 | 0.2 + 0.8 | 4 | 4 | 12 | 12.0 | 29 | 1.00 | 0.41 | |
| 9 | 4 | 4 | 0.17 + 0.83 | 2 | 2 | 13 | 15.2 | 29 | 1.00 | 0.45 | |
| 10 | 1 | 4 | 0.1 + 0.9 | 4 | 4 | 14 | 14.0 | 30 | 1.03 | 0.47 | |
| 11 | 4 | 4 | 0.115 + 0.885 | 2 | 4 | 15 | 15.0 | 31 | 1.02 | 0.48 | |
| 12 | 4 | 8 | 0.09 + 0.910 | 2 | 1 | 16 | 25.4 | 30 | 1.28 | 0.53 | 7 & 10 |
| 13 | 4 | 4 | 0.1 + 0.9 | 4 | 4 | 17 | 17.0 | 29 | 1.83 | 0.59 | 15 |
| 14 | 1 | 6 | 0.05 + 0.95 | 4 | 6 | 18 | 18.0 | 31 | 1.61 | 0.58 | 2, 4, 9 |
| 15 | 2 | 4 | 0.14 + 0.86 | 8 | 4 | 19 | 19.0 | 31 | 1.57 | 0.61 | 11, 14, 16 |
| 16 | 1 | 6 | 0.09 + 0.91 | 4 | 8 | 20 | 20.0 | 31 | 1.71 | 0.65 | 2, 3, 11, 14, 18 |

Table 4 shows the detailed calculations for the load bank system circuit/topology (100) where each of the Sr. No. of the table represent a load bank system having defined load values. Columns 2, 3, 4, 5 and 6 provides the load values Load1, Load2, Load3, Load4 and Load5 in kW. These load values are defined by the resistance values of R1, R2, R3, R4 and R5 respectively. The load values have been calculated for voltage V of 1000 volts. Following table, Table 5 shows the load value and the actual value of resistance, alternatively resistor values vs resistor power ratings at 1000 V:

TABLE 5

| Resistance (Ω) | 1000 | 500 | 250 | 166.6 | 125 |
|---|---|---|---|---|---|
| Load (kW) at 1000 V | 1 | 2 | 4 | 6 | 8 |

Column 7 of the table 4 shows the total load $P_{T5T6}$ available at terminals T5 and T6.

For exemplary analysis, consider load bank system represented at Sr. No. 1 of table 4. In this example, loads Load1 to Load5 are of 1 kW rating i.e. 1000Ω each. The Tap on resistor R3 has been fixed so as to get R3A=700Ω, and for (R3A+R3B), generates least number of duplicate values. The number of steps captured in Table 4, are after subtracting the duplicates from 31.

The MAX/MIN ratio for load bank system of Sr. No. 1 of table 4, is 13.5. The maximum load is 5 kW. Hence the minimum load is given by:

Load MIN=5/13.5=0.37 kW

The average resolution in this example of load bank system of Sr. No. 1 of table 4 is 0.19. However, there are few jumps which are bigger. Hence, the biggest jump has been captured in MAX resolution column. Here it is 0.6 kW. The FIG. 5 shows plot of $R_{T5T6}$ for this example.

From Table 4, it is observed that, in the range 5 kW to 15 kW, the topology produces large number of steps, good average resolution and no missing steps. However, 16 kW onwards, there are few missing steps.

A comparison of prior art load calculation control apparatus (20) with load bank system (100) of the present invention is given below in Table 7. The Sr. Nos. 1 of Table 1 and load bank system of Sr. No. 1 of Table 4 are considered for this comparison.

TABLE 7

| FIG. No | Table No | Sr No | MIN Load (kW) | MAX Load (kW) | MAX/ MIN Ratio | No of Steps (Nos) | MAX Reso (kW) | Av Reso (kW) |
|---|---|---|---|---|---|---|---|---|
| 2 | 1 | 1 | 1.00 | 5.00 | 5.00 | 5 | 1.00 | 1.00 |
| 4 | 4 | 1 | 0.37 | 5.00 | 13.50 | 27 | 0.60 | 0.19 |

From the above table, it is very clear that the load bank system circuit/topology (100) of the present invention provides significant improvement over the prior art, for all the parameters captured in the above table. Plot of $P_{TST6}$ is given in FIG. 5. Further, the load bank having same resistor values (R1 to R5) offers additional advantages. It is easier to design, and is more cost effective. Also, from maintenance point of view, the number of spares required are less. This aspect becomes more significant for three phase load banks.

In an implementation according to an alternative embodiment of the present invention, two taps (Tap1 and Tap2) on resistor R3 has been used and an extra sixth relay switch RL6 has been included to the load bank system circuit/topology to overcome the issue of missing steps encountered in the load bank system of Sr. Nos. 12 to 15 of the Table 4. The FIG. 6 illustrates load bank system circuit/topology (110) that additionally includes two taps (Tap1 and Tap2) on resistor R3 and an extra sixth relay switch RL6. As illustrated in FIG. 6 a pole terminal of RL6 is connected to the NO terminals of RL2 and RL4. A NO terminal of RL6 is connected to Tap1. A NC terminal of RL6 is connected to Tap2. When RL6 is energized, Tap1 is selected. For this condition, one set of Load values $P_{T7T8}$ are obtained. Similarly, when RL6 is turned OFF, another set of Load values for $P_{T7T8}$ are obtained. Hence along with switching RL1 to RL5 relays, RL6 is also switched ON or OFF, to get more number of steps.

The exemplary detailed analysis for the load bank system circuit/topology (110) of Sr. No. 12 (16 kW) of Table 4 is depicted in Table 8 attached as FIGS. 14 and 15. Referring to the table 8 the first three columns shows values with RL6 ON, the next three columns shows values with RL6 OFF and the remaining four columns shows the combination of both the tables. The duplicate values are highlight in grey and the high power difference loading steps are highlighted in black with white font.

Further, Table 9 provides detailed calculations for load bank system having two taps design (110) as illustrated in FIG. 6. In this case, due to one extra relay, total of 63 steps are obtained excluding the load bank off condition (zero load) step. The number of steps captured in Table 9 are after the subtracting the duplicated values. Thus, better average resolution is obtained and the missing steps are eliminated.

TABLE 9

| Sr. No | Load 1 (kW) | Load 2 (kW) | RL6_ON Load3 (kW) | RL6_OFF Load3 (kW) | Load 4 (kW) | Load 5 (kW) | Load $P_{T7T8}$ (kW) | MAX/ MIN Ratio | No of Steps (Nos) | MAX Res. (kW) | Av. Res. (kW) | Missing Step (kW) |
|---|---|---|---|---|---|---|---|---|---|---|---|---|
| 12 | 4 | 8 | 0.09 + 0.910 | 0.15 + 0.85 | 2 | 1 | 16 | 26.4 | 52 | 1 | 0.31 | |
| 13 | 4 | 4 | 0.1 + 0.9 | 0.325 + 0.675 | 4 | 4 | 17 | 17 | 50 | 1.03 | 0.34 | |
| 14 | 1 | 6 | 0.05 + 0.95 | 0.15 + 0.85 | 4 | 6 | 18 | 18 | 53 | 1.00 | 0.34 | |
| 15 | 2 | 4 | 0.32 + 0.68 | 0.85 + 0.915 | 8 | 4 | 19 | 19 | 52 | 1.00 | 0.37 | |
| 16 | 1 | 6 | 0.05 + 0.95 | 0.185 + 0.815 | 4 | 8 | 20 | 18.7 | 53 | 1.25 | 0.38 | 19.00 |

FIG. 7 illustrates a load bank system circuit/topology (120) according to another alternate embodiment of the present invention for getting more loading steps and better resolution. In this embodiment, as illustrated in FIG. 7 the resistor R3 has 3 taps, i.e. Tap1, Tap2 and Tap3. The tap selection is done by using a rotary switch RSW. A pole terminal of RSW is connected to the NO terminals of RL2 and RL4.

The Tap1 is connected to first terminal of RSW. The Tap2 is connected to second terminal of RSW. The Tap3 is connected to third terminal of RSW.

FIG. 8 illustrates a load bank system circuit/topology (130) according to another embodiment of the present invention for getting more loading steps and better resolution. In this embodiment, as illustrated in FIG. 8, a potentiometer (R3_POT) has been used in place of tapped resistor R3 (130). By adjusting the R3_POT, it is possible to get desired value of loading step for the given combination of relays RL1 to RL5.

Table 10 provides equations for tap voltage and relay current calculations.

TABLE 10

| SrNo | Vtap Equations | Current RL1 | Current RL2 | Current RL3 | Current RL4 | Current RL5 |
|---|---|---|---|---|---|---|
| 1 | Vab (No current) | 0.0 | 0.0 | 0.0 | 0.0 | 0.0 |
| 2 | Vab * (R4 + R5)/(R3A + R4 + R5) | 0.0 | 0.0 | 0.0 | Vab/(R3A + R4 + R5) | 0.0 |
| 3 | Vab * R2/(R2 + R3A) | 0.0 | Vtap/R2 | 0.0 | 0.0 | 0.0 |
| 4 | Vab * (R2 ‖ (R4 + R5))/ (R3A + (R2 ‖ (R4 + R5))) | 0.0 | Vtap/R2 | 0.0 | Vtap/(R4 + R5) | 0.0 |

TABLE 10-continued

| SrNo | Vtap Equations | Current RL1 | Current RL2 | Current RL3 | Current RL4 | Current RL5 |
|---|---|---|---|---|---|---|
| 5 | Vab (No current) | 0.0 | 0.0 | 0.0 | 0.0 | Vab/R5 |
| 6 | Vab * R2/(R2 + R3A) | Vab/R1 | Vtap/R2 | 0.0 | 0.0 | 0.0 |
| 7 | Vab * (R2 ‖ (R4 + R5))/ (R3A + (R2 ‖ (R4 + R5))) | Vab/R1 | Vtap/R2 | 0.0 | Vtap/(R4 + R5) | 0.0 |
| 8 | Vab * R2/((R3A ‖ R4) + R2) | 0.0 | Vtap/R2 | 0.0 | (Vab − Vtap)/R4 | Vab/R5 |
| 9 | Vab (No current) | 0.0 | 0.0 | 0.0 | Vab/R4 | Vab/(R4 ‖ R5) |
| 10 | Vab (No current) | Vab/(R1 ‖ R2) | Vab/R2 | 0.0 | 0.0 | 0.0 |
| 11 | Vab * (R4 + R5)/(R3A + R4 + R5) | Vab/(R1 ‖ R2) | 0.0 | 0.0 | Vab/(R3A + R4 + R5)) | 0.0 |
| 12 | Vab * R2/(R2 + R3A) | 0.0 | Vtap/R2 | 0.0 | Vab/R4 | Vab/(R4 ‖ R5) |
| 13 | Vab * R2/((R3A ‖ R4) + R2) | Vab/R1 | Vtap/R2 | 0.0 | 0.0 | Vab/R5 |
| 14 | Vab (No current) | Vab/(R1 ‖ R2) | Vab/R2 | 0.0 | 0.0 | Vab/R5 |
| 15 | Vab * R2/(R2 + R3A) | Vab/R1 | Vtap/R2 | 0.0 | Vab/(R4) | Vab/(R4 ‖ R5) |
| 16 | Vab | Vab/(R1 ‖ R2) | Vab/R2 | 0.0 | Vab/R4 | Vab/(R4 ‖ R5) |
| 17 | Vab * (R3B ‖ (R4 + R5))/ (R3A + (R3B ‖ (R4 + R5))) | 0.0 | 0.0 | Vtap/R3B | (Vab − Vtap)/R4 | 0.0 |
| 18 | Vab * (R2 ‖ R3B)/(R3A + (R2 ‖ R3B)) | 0.0 | Vtap/R2 | Vtap/R3B | 0.0 | 0.0 |
| 19 | Vab * (R2 ‖ R3B ‖ (R4 + R5))/ (R3A + (R2 ‖ R3B ‖ (R4 + R5))) | 0.0 | Vtap/R2 | Vtap/R3B | Vtap/(R4 + R5) | 0.0 |
| 20 | Vab * R3B/(R3B + (R3A ‖ R4)) | 0.0 | 0.0 | Vtap/R3B | (Vab − Vtap)/R4 | Vab/R5 |
| 21 | Vab * (R2 ‖ R3B)/(R3A + (R2 ‖ R3B)) | Vab/R1 | Vtap/R2 | Vtap/R3B | 0.0 | 0.0 |
| 22 | Vab * (R2 ‖ R3B ‖ (R4 + R5))/ (R3A + (R2 ‖ R3B ‖ (R4 + R5))) | Vab/R1 | Vtap/R2 | Vtap/R3B | Vab/R4 | Vab/(R4 ‖ R5) |
| 23 | Vab * (R2 ‖ R3B)/ ((R3A ‖ R4) + (R2 ‖ R3B)) | 0.0 | Vtap/R2 | Vtap/R3B | (Vab − Vtap)/R4 | (Vab/R5) + ((Vab − Vtap)/R4) |
| 24 | Vab * R3B/(R3A + R3B) | 0.0 | 0.0 | Vtap/R3B | Vab/R4 | Vab/(R4 ‖ R5) |
| 25 | Vab * R3B/(R3A + R3B) | Vab/(R1 ‖ R2) | Vab/R2 | Vtap/R3B | 0.0 | 0.0 |
| 26 | Vab * (R3B ‖ (R4 + R5))/ (R3A + (R3B ‖ (R4 + R5))) | Vab/(R1 ‖ R2) | Vab/R2 | Vtap/R3B | Vtap/(R4 + R5) | 0.0 |
| 27 | Vab * (R2 ‖ R3B)/(R3A + (R2 ‖ R3B)) | 0.0 | Vtap/R2 | Vtap/R3B | Vab/R4 | Vab/(R4 ‖ R5) |
| 28 | Vab * (R2 ‖ R3B)/ ((R3A ‖ R4) + (R2 ‖ R3B)) | Vab/R1 | Vtap/R2 | Vtap/R3B | (Vab − Vtap)/R4 | (Vab/R5) + ((Vab − Vtap)/R4) |
| 29 | Vab * R3B/(R3B + (R3A ‖ R4)) | Vab/(R1 ‖ R2) | Vab/R2 | Vtap/R3B | (Vab − Vtap)/R4 | (Vab/R5) + ((Vab − Vtap)/R4) |
| 30 | Vab * (R2 ‖ R3B)/(R3A + (R2 ‖ R3B)) | Vab/R1 | Vtap/R2 | Vtap/R3B | Vab/R4 | Vab/(R4 ‖ R5) |
| 31 | Vab * R3B/(R3A + R3B) | Vab/(R1 ‖ R2) | Vab/R2 | Vtap/R3B | Vab/R4 | Vab/(R4 ‖ R5) |
| 32 | Vab * R3B/(R3A + R3B) | 0.0 | 0.0 | Vtap/R3B | 0.0 | 0.0 |

The Table 10 provides analysis and equations for tap voltage and relay current calculations. For the analysis here the Table 3 also is referred. As depicted in Table 10, second column shows the equations for calculating the voltage Vtap at Tap point. (See FIG. 4). Using Vtap values, it is possible to calculate the current flowing through each of the relays RL1 to RL5. Columns 3, 4, 5, 6 and 7 provide the equations for current through RL1 to RL5 respectively. The relay status shown in Table 3 maps with the rows in Table 10.

Table 11 shows the comparison of maximum current flowing through the Switches CL1 to CL5 of prior art (20) and current flowing through relays RL1 to RL5 of load bank system circuit/topology (100) of the present invention.

TABLE 11

| Total Load (kW) | CL1 Current (A) | CL2 Current (A) | CL3 Current (A) | CL4 Current (A) | CL5 Current (A) | RL1 Current (A) | RL2 Current (A) | RL3 Current (A) | RL4 Current (A) | RL5 Current (A) |
|---|---|---|---|---|---|---|---|---|---|---|
| 5 | 1 | 1 | 1 | 1 | 1 | 2 | 1 | 1.4 | 1 | 2 |
| 6 | 1 | 1 | 1 | 1 | 2 | 2 | 1 | 1.55 | 1 | 3 |
| 7 | 1 | 1 | 1 | 2 | 2 | 3 | 2 | 1.01 | 1 | 4.2 |
| 8 | 1 | 1 | 2 | 2 | 2 | 4 | 2 | 1.55 | 1 | 3 |
| 9 | 1 | 2 | 2 | 2 | 2 | 4 | 2 | 1.97 | 2 | 4 |
| 10 | 1 | 1 | 2 | 2 | 4 | 5 | 4 | 1.11 | 2 | 4 |
| 11 | 1 | 2 | 2 | 2 | 4 | 6 | 4 | 1.06 | 2 | 4.14 |
| 12 | 1 | 1 | 2 | 4 | 4 | 3 | 2 | 1.1 | 4 | 8 |
| 13 | 1 | 2 | 2 | 4 | 4 | 8 | 4 | 1.05 | 2 | 4.34 |
| 14 | 1 | 1 | 2 | 2 | 8 | 5 | 4 | 1.03 | 4 | 8.17 |
| 15 | 1 | 2 | 4 | 4 | 4 | 8 | 4 | 1.02 | 2 | 6.82 |
| 16 | 1 | 1 | 2 | 4 | 8 | 12 | 8 | 1.01 | 3.03 | 5.55 |
| 17 | 1 | 2 | 2 | 4 | 8 | 8 | 4 | 1.03 | 4 | 8 |
| 18 | 1 | 1 | 4 | 4 | 8 | 7 | 6 | 1.01 | 4 | 10.54 |
| 19 | 1 | 2 | 4 | 4 | 8 | 6 | 4 | 1.08 | 8 | 12 |
| 20 | 1 | 1 | 2 | 8 | 8 | 7 | 6 | 1.02 | 4 | 12 |
| 32 | 1 | 2 | 4 | 8 | 16 | | | | | |

23 24

FIG. 9 shows cascading of two load banks. Load Bank 1 is of 6 kW rating. Load Bank 2 is of 20 kW rating. The Table 12 provides load bank system details used for cascading as illustrated in FIG. 9.

TABLE 12

| Bank No | Load 1 (kW) | Load 2 (kW) | Load 3 (kW) | Load 4 (kW) | Load 5 (kW) | Bank Load (kW) | Load $P_{T13T14}$ (kW) | MIN Load | MAX Load kW | MAX/ MIN Ratio | No of Steps Nos | AV Reso (kW) |
|---|---|---|---|---|---|---|---|---|---|---|---|---|
| 1 | 1 | 2 | 0.575 + 0.425 | 1 | 1 | 6 | 26 | 0.388 | 26 | 67.01 | 780 | 0.033 |
| 2 | 1 | 6 | 0.09 + 0.91 | 4 | 8 | 20 | | | | | | |

By cascading these two banks, it is possible to generate very large number of steps. Total number of steps are calculated as follows:

1) No of steps of Bank1 when Bank2 is OFF=31
2) No of steps of Bank2 when Bank1 is OFF=31
3) No of steps when Bank1 and Bank2 are active=31*31=961
4) Total Number of steps=1023

It is observed that, out of 1023 steps, some steps will have duplicate values. After subtracting these duplicate values, we get 780 unique steps. The FIG. 10 illustrates a plot of $P_{T13T14}$ for the cascade of two load bank systems of the present invention as illustrated in FIG. 9.

Further, the load bank system circuit/topology can be used for 3 phase applications. FIG. 11 shows star connected load bank. FIG. 12 shows delta connected load bank.

It should be noted that the description merely illustrates the principles of the present invention. It will thus be appreciated that those skilled in the art will be able to devise various arrangements that, although not explicitly described herein, embody the principles of the present invention. Furthermore, all examples recited herein are principally intended expressly to be only for explanatory purposes to help the reader in understanding the principles of the invention and the concepts contributed by the inventor(s) to furthering the art and are to be construed as being without limitation to such specifically recited examples and conditions. Moreover, all statements herein reciting principles, aspects, and embodiments of the invention, as well as specific examples thereof, are intended to encompass equivalents thereof.

I claim:

1. A load bank system for generating large number of loading steps, the load bank system comprising:

at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test, wherein a pole terminal of the RL1 is electrically coupled to a first terminal of the resistor R1 and to a NC (Normally Closed) terminal of the RL2;

a NC terminal of the RL1 is left open;

a NO (Normally Open) terminal of the RL1 is electrically coupled to the terminal T5 of the load bank;

a pole terminal of the RL2 is electrically coupled to a first terminal of the resistor R2;

a first terminal of the resistor R3 is electrically coupled to the T5 terminal of load bank; a second terminal of the resistor R3 is electrically coupled to a pole terminal of the RL3;

the Tap of R3 is moved to a desired location on the resistor R3 and is fixed to divide the resistor R3 in parts;

the Tap is electrically coupled to a NO terminal of RL2 and a NO terminal of RL4;

a pole terminal of RL4 is electrically coupled to a first terminal of R4;

a second terminal of R4 is electrically coupled to a pole terminal of RL5;

a first terminal of R5 is electrically coupled to a pole terminal of RL5;

a NO terminal of RL5 is electrically coupled to the terminal T5 of load bank;

a NC terminal of RL5 is left open;

a second terminal of R1, a second terminal of R2 and a second terminal of R5 are electrically coupled to the terminal T6 of the load bank; and a NO terminal of RL3 and a NC terminal of RL4 is electrically coupled to the terminal T6.

2. The system as claimed in claim 1 wherein the system is configured to provide at least one combination of the plurality of switches to generate load bank off condition (zero load step).

3. The system as claimed in claim 1, wherein the resistor R3 is a special resistor having at least one tap, the tap moved to the desired location on the resistor R3 and fixed, dividing the resistor R3 into a plurality of sections.

4. The system as claimed in the claim 1 wherein the desired location of the tap on the resistor R3 is determined as the splitting spot on the resistor R3 splitting the resistor R3 into the plurality of sections such that maximum number of discrete loading steps are generated, minimum number of duplicate loading steps are generated and minimum number of high power difference loading steps are generated.

5. The system as claimed in claim 4 wherein a loading step is considered as high power difference loading step when difference in the effective power of the previous loading step and the loading step under consideration is greater than 50% of the base resistance power value of the load bank.

6. The system as claimed in claim 1, wherein the load value of the resistor R3 is always the base resistance power value of the load bank.

7. The system as claimed in claim 1, wherein the resistor R3 having one tap, is divided by the tap into two sections, the section of resistor between the first terminal of R3 and tap is R3A and section of resistor between tap and second terminal of R3 is R3B.

8. The system as claimed in claim 1 wherein the system is configured to have one tap at the tap resistor R3 to provide at least 31 loading steps including at least 27 unique value loading steps, not more than 4 repetitive value loading steps and excluding at least one zero load (load bank off condition) step.

9. The system as claimed in claim 1 wherein the system is configured to have more than one tap at the tap resistor R3 and an additional switch RL6, the RL6 being single pole double throw (SPDT) switch or rotary switch (RSW), to increase the number of loading steps provided by the system, more than 32 loading steps including at least one zero load (load bank off condition) step.

10. The system as claimed in claim 1 wherein the plurality of switches are operated in possible combination to generate the plurality of loading steps.

11. The system as claimed in claim 1 wherein the resistor R3 of the system is a tap resistor having one or more taps or a potentiometer.

12. The system as claimed in claim 1 wherein the system is configured to generate large number of loading steps when the resistors used for the load bank system are single value resistors (all resistors with identical values) or the resistors used for the load bank system are multi value resistors (resistors with at least two different values).

13. The system as claimed in claim 1 wherein the plurality of switches are relays, or single pole double throw (SPDT) switches, or contactors or SPDT solid state switches or any other similar devices.

14. The system as claimed in claim 1 wherein the system is configured to provide high maximum to minimum load ratio and lowest value average resolution of the loading step.

15. The plurality of load bank systems as claimed in claim 1 can be cascaded to provide very high number of loading steps.

16. The system as claimed in claim 1 wherein the system is connected as star connected load bank or delta connected load bank for using in 3 phase application.

17. A method comprising:

providing, a load bank system for generating large number of loading steps having at least five switches RL1, RL2, RL3, RL4, RL5, at least five resistors R1, R2, R3, R4, R5, the R3 a special tap resistor having at least one tap movable along the length of the resistor R3 and divide the resistor into parts, at least two terminals, terminal T5, terminal T6 for connecting the load bank to a power source under test, wherein a pole terminal of the RL1 is electrically coupled to a first terminal of the resistor R1 and to a NC (Normally Closed) terminal of the RL2;

a NC terminal of the RL1 is left open;

a NO (Normally Open) terminal of the RL1 is electrically coupled to the terminal T5 of the load bank;

a pole terminal of the RL2 is electrically coupled to a first terminal of the resistor R2;

a first terminal of the resistor R3 is electrically coupled to the T5 terminal of load bank;

a second terminal of the resistor R3 is electrically coupled to a pole terminal of the RL3;

the Tap of R3 is moved to a desired location on the resistor R3 and is fixed to divide the resistor R3 in parts;

the Tap is electrically coupled to a NO terminal of RL2 and a NO terminal of RL4;

a pole terminal of RL4 is electrically coupled to a first terminal of R4;

a second terminal of R4 is electrically coupled to a pole terminal of RL5;

a first terminal of R5 is electrically coupled to a pole terminal of RL5;

a NO terminal of RL5 is electrically coupled to the terminal T5 of load bank;

a NC terminal of RL5 is left open;

a second terminal of R1, a second terminal of R2 and a second terminal of R5 are electrically coupled to the terminal T6 of the load bank;

a NO terminal of RL3 and a NC terminal of RL4 are electrically coupled to the terminal T6;

connecting, the load bank system/circuit to a power source under test through the two terminals, terminal T5, and terminal T6;

operating, the plurality of switches in possible combination to generate the plurality of loading steps.

18. The method as claimed in claim 17 wherein the method provides at least one combination of the plurality of switches to generate load bank off condition (zero load step).

19. The method as claimed in claim 17, wherein the resistor R3 have at least one tap, the tap moved to the desired location on the resistor R3 and fixed, dividing the resistor R3 into a plurality of sections.

20. The method as claimed in the claim 17 wherein the desired location of the tap on the resistor R3 is determined as the splitting spot on the resistor R3 splitting the resistor R3 in to the plurality of sections such that maximum number of discrete steps are generated, minimum number of duplicate loading steps are generated and minimum number of high power difference loading steps are generated.

21. The method as claimed in claim 17 wherein a loading step is considered as high power difference loading step when difference in the effective power of the previous loading step and the loading step under consideration is greater than 50% of the base resistance power value of the load bank.

22. The method as claimed in claim 17, wherein the load value of the resistor R3 is always the base resistance power value of the load bank.

23. The method as claimed in claim 17 wherein the tap resistor R3 have one tap to provide at least 31 loading steps including at least 27 unique value loading steps, not more than 4 repetitive value loading steps and excluding at least one zero load (load bank off condition) step.

24. The method as claimed in claim 17 wherein the resistor R3 have more than one tap and an additional switch RL6, the RL6 being single pole double throw (SPDT) switch or rotary switch (RSW), to increase the number of loading steps provided by the system, more than 32 loading steps including at least one zero load (load bank off condition) step.

25. The method as claimed in claim 17 wherein the plurality of switches are operated in possible combination to generate the plurality of loading steps.

26. The method as claimed in claim 17 wherein the resistor R3 is a tap resistor having one or more taps or a potentiometer.

27. The method as claimed in claim 17 generates large number of loading steps when the resistors used for the load bank system are single value resistors (all resistors with identical values) or the resistors used for the load bank system are multi value resistors (resistors with at least two different values).

28. The method as claimed in claim 17 wherein the plurality of switches are relays, or single pole double throw (SPDT) switches, or contactors or SPDT solid state switches or any other similar devices.

29. The method as claimed in claim 17 provides high maximum to minimum load ratio and lowest value average resolution of the loading step.

* * * * *